United States Patent
Ra

(10) Patent No.: US 6,335,553 B1
(45) Date of Patent: Jan. 1, 2002

(54) NONVOLATILE SEMICONDUCTOR MEMORY AND METHOD OF FABRICATION

(75) Inventor: Kyeong Man Ra, Chungcheongbuk-do (KR)

(73) Assignee: LG Semicon Co., Ltd., Chungcheonbuk-do (KR)

( * ) Notice: Subject to any disclaimer, the term of this patent is extended or adjusted under 35 U.S.C. 154(b) by 0 days.

(21) Appl. No.: 09/499,381

(22) Filed: Feb. 7, 2000

Related U.S. Application Data

(62) Division of application No. 09/079,445, filed on May 15, 1998, now Pat. No. 6,037,226.

(30) Foreign Application Priority Data

May 26, 1997 (KR) .............................................. 97/20735

(51) Int. Cl.[7] .............................................. H01L 29/76
(52) U.S. Cl. ...................... 257/314; 257/314; 257/315; 257/322; 438/201; 438/211; 438/257
(58) Field of Search ................... 257/322, 314, 257/315; 438/201, 211, 257

(56) References Cited

U.S. PATENT DOCUMENTS

| | | | |
|---|---|---|---|
| 5,010,028 A | 4/1991 | Gill et al. ................... 438/263 |
| 5,047,362 A | 9/1991 | Bergemont | |
| 5,053,841 A | * 10/1991 | Miyakawa et al. ......... 357/23.5 |
| 5,147,813 A | * 9/1992 | Woo .............................. 437/43 |
| 5,156,990 A | * 10/1992 | Mitchell ....................... 437/43 |
| 5,352,619 A | 10/1994 | Hong ........................ 438/263 |
| 5,385,856 A | * 1/1995 | Hong ............................ 437/43 |
| 5,427,966 A | * 6/1995 | Komori et al. ................ 437/43 |
| 5,763,309 A | 6/1998 | Chang ........................ 438/262 |
| 5,888,871 A | * 3/1999 | Cho et al. ................... 438/263 |
| 5,966,328 A | * 10/1999 | Kobatake ................ 365/185.14 |
| 5,989,960 A | * 11/1999 | Fukase ......................... 438/267 |
| 6,016,273 A | * 1/2000 | Seki et al. ............. 365/185.22 |
| 6,136,648 A | * 10/2000 | Oya ............................ 438/257 |
| 6,144,064 A | * 11/2000 | Cho et al. ................... 257/321 |

FOREIGN PATENT DOCUMENTS

| | | | |
|---|---|---|---|
| EP | 403034581 | * 2/1991 | |
| JP | 355087491 | * 7/1980 | ................. 257/319 |
| JP | 408153811 | * 6/1996 | |

OTHER PUBLICATIONS

Kume, et al, "A 1.28 $\mu m^2$ Contact Memory Cell Technology for a 3V–Only 64Mbit EEPROM, IEDM," IEDM 92, p.p. 92–991 to 92–993.

* cited by examiner

*Primary Examiner*—Eddie Lee
*Assistant Examiner*—Eugene Lee
(74) *Attorney, Agent, or Firm*—Birch, Stewart, Kolasch & Birch, LLP

(57) ABSTRACT

A contactless, nonvolatile metal oxide semiconductor memory device having a rectangular array of memory cells interconnected by word-lines in the row direction of the array and bit-lines in the column direction of the array. Each memory cell has a structurally asymmetrical pair of floating gate, MOS field effect transistors of the same row that share a common source region (bit line) within a semiconductor substrate. The asymmetry of the structure of the floating gates of the two transistors enables programming/reading and monitoring of the cell to be effected simultaneously. The structure of the floating gate is also responsible for a relatively large capacitive coupling between the floating gates and the control gate (word line) which lies above them. Since the floating gates essentially serve as a mask for implantation of program/read and monitor drain regions within the substrate, fabrication of the device incorporates self-aligning process steps.

20 Claims, 23 Drawing Sheets

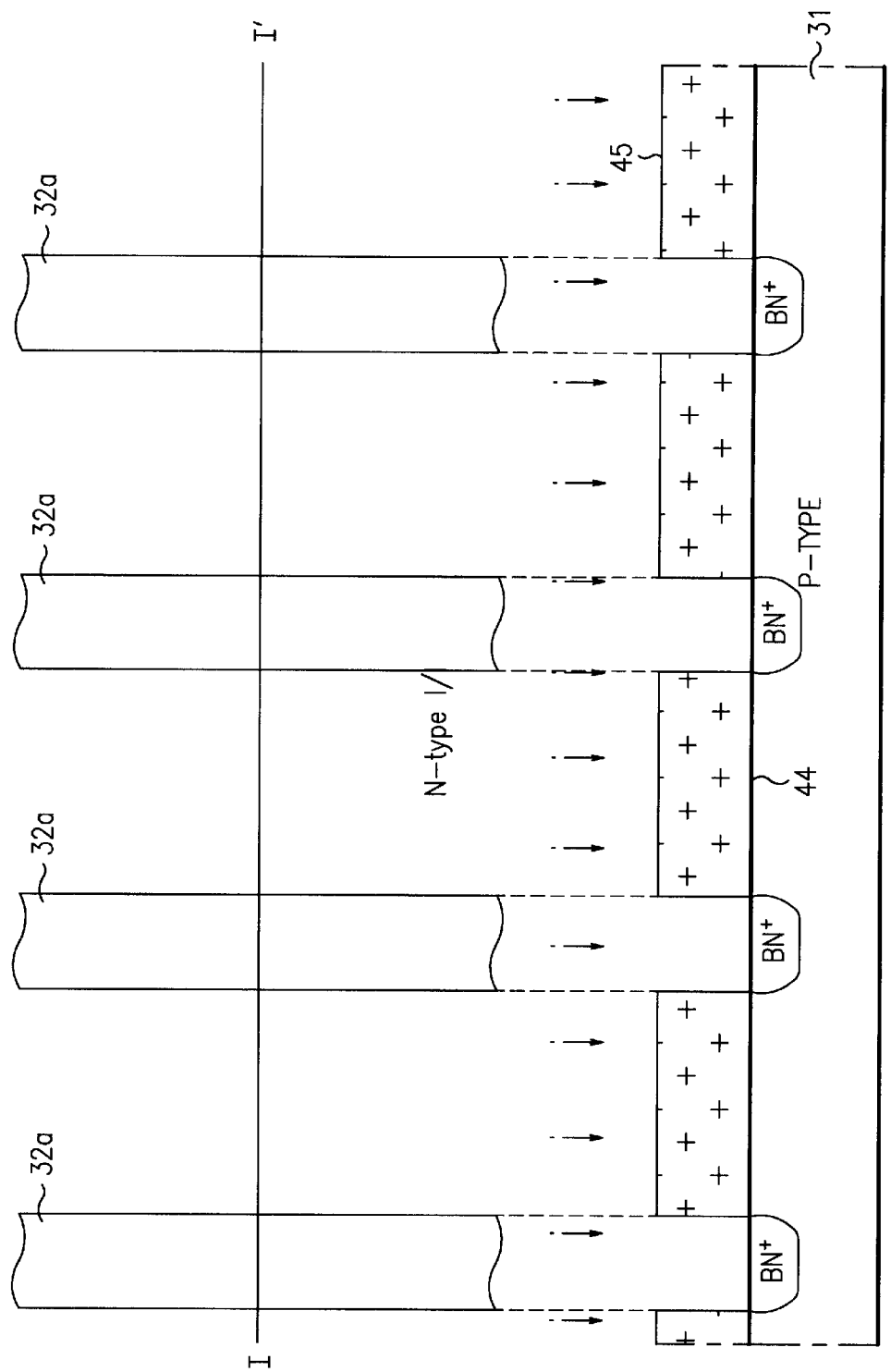

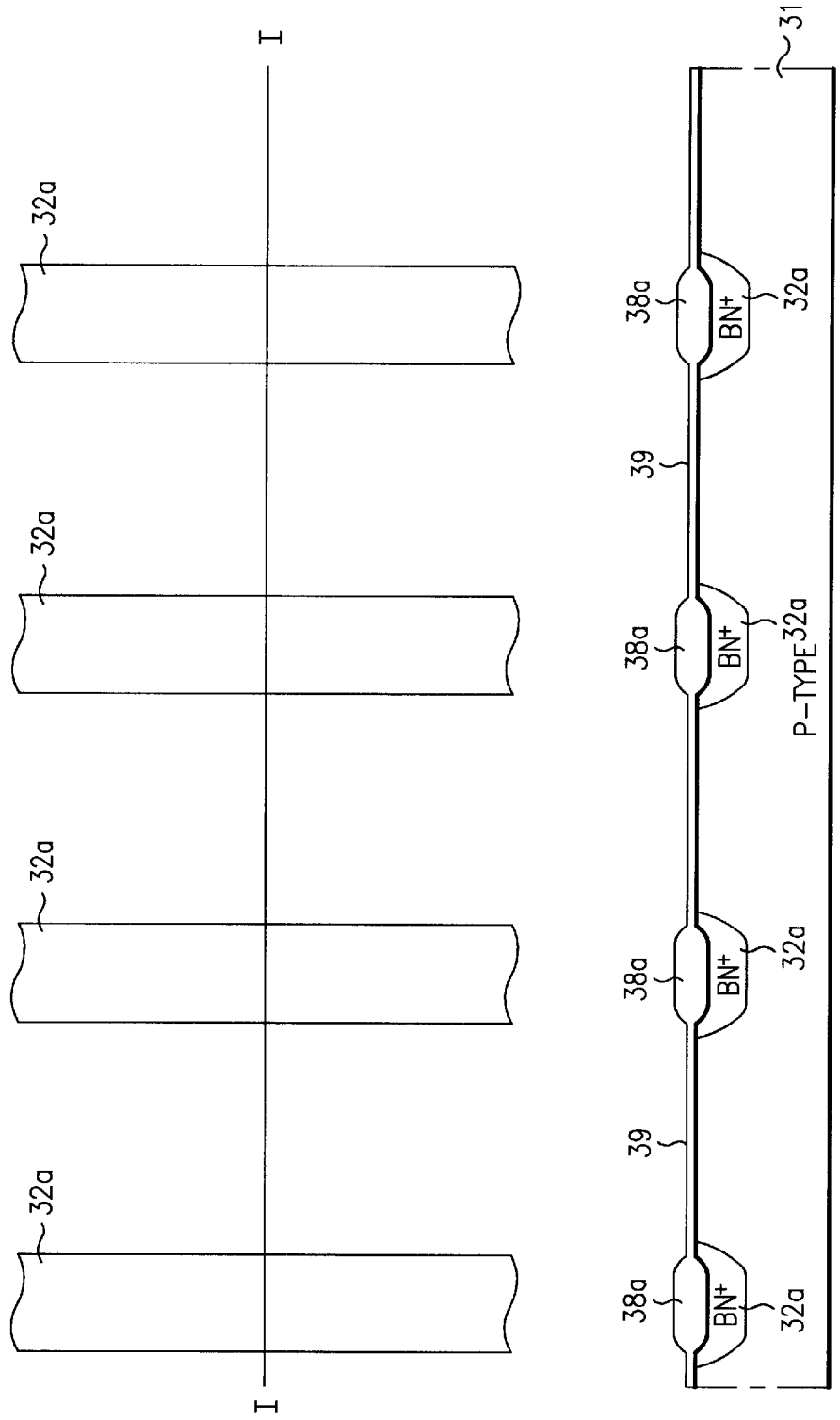

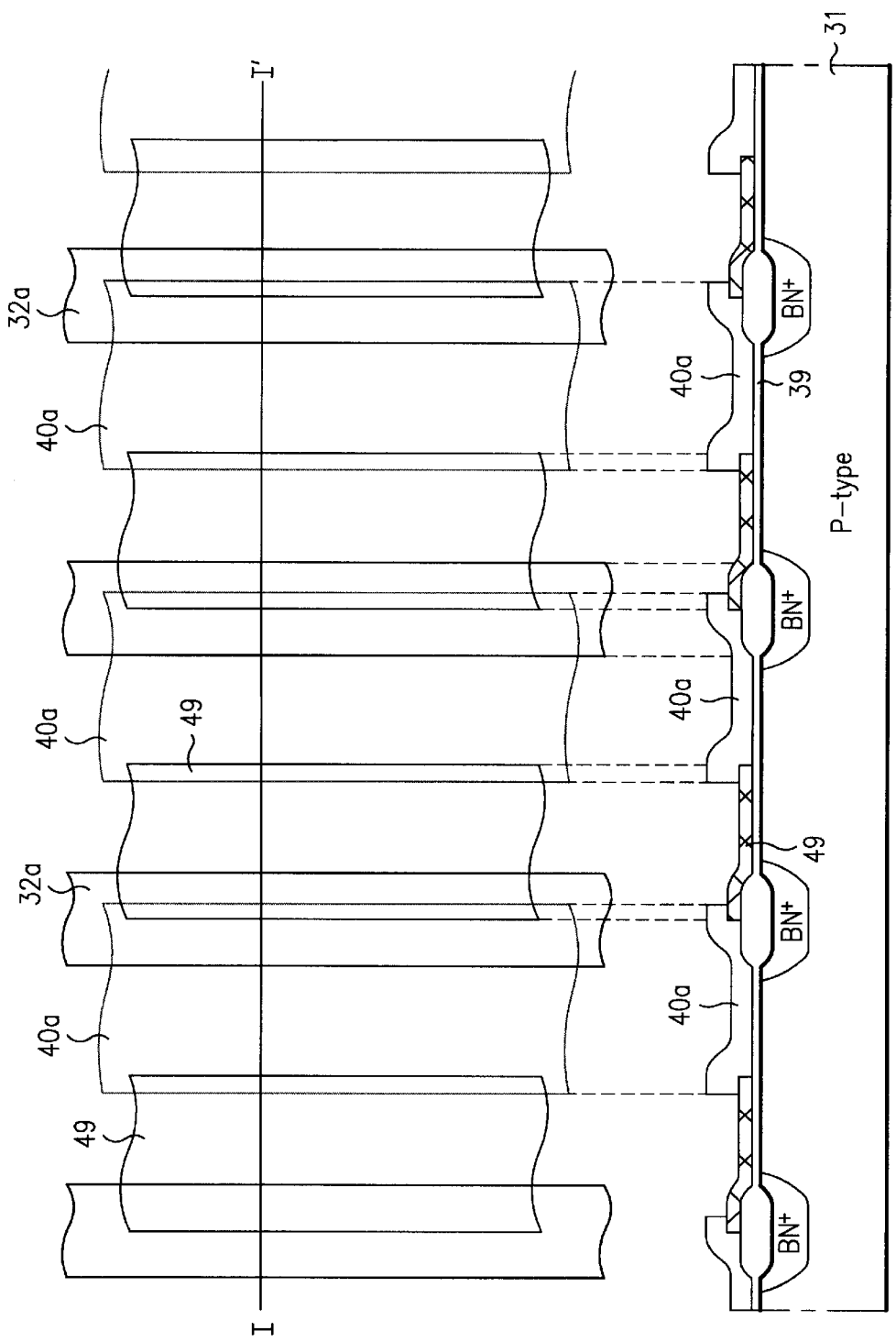

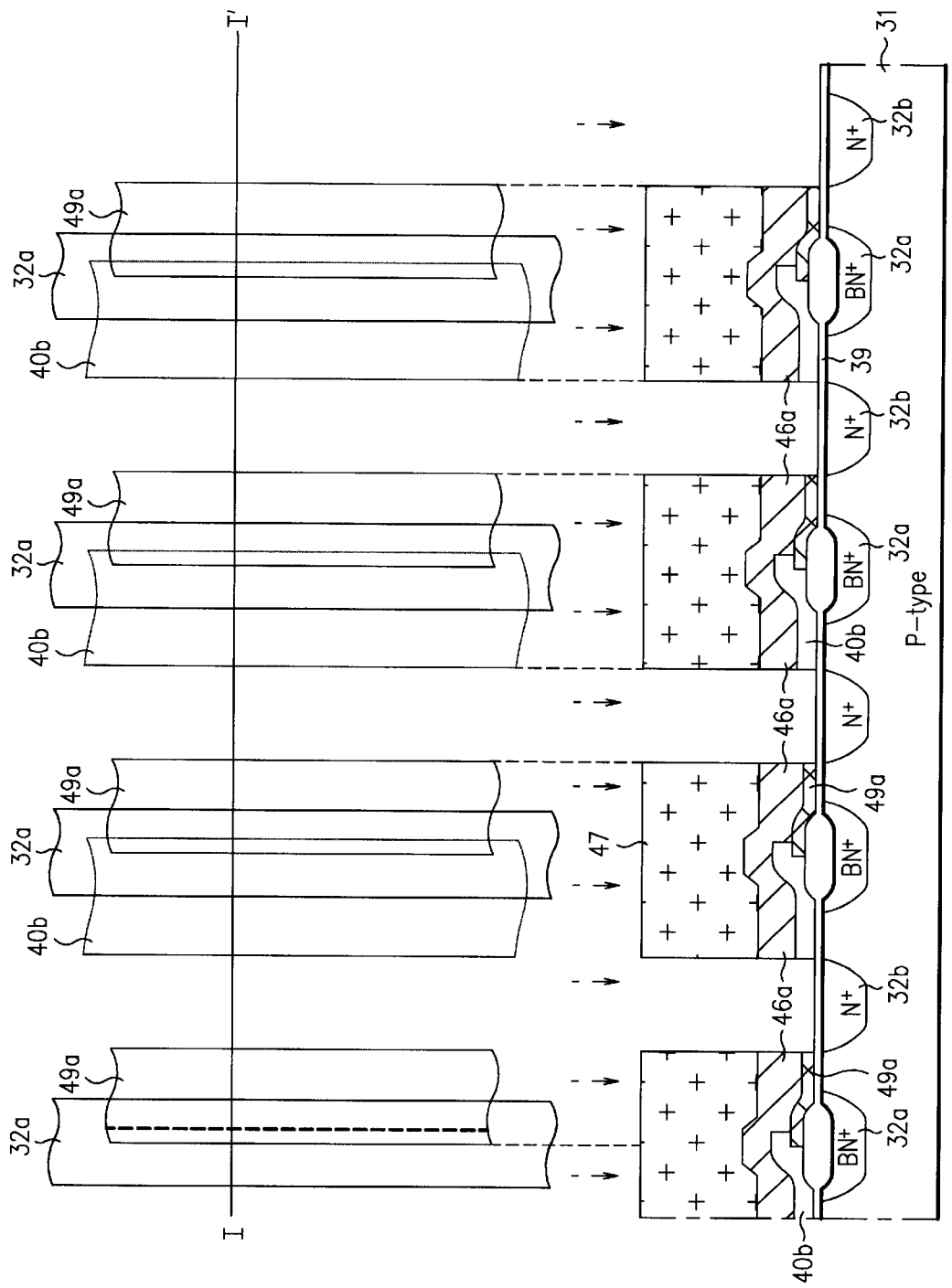

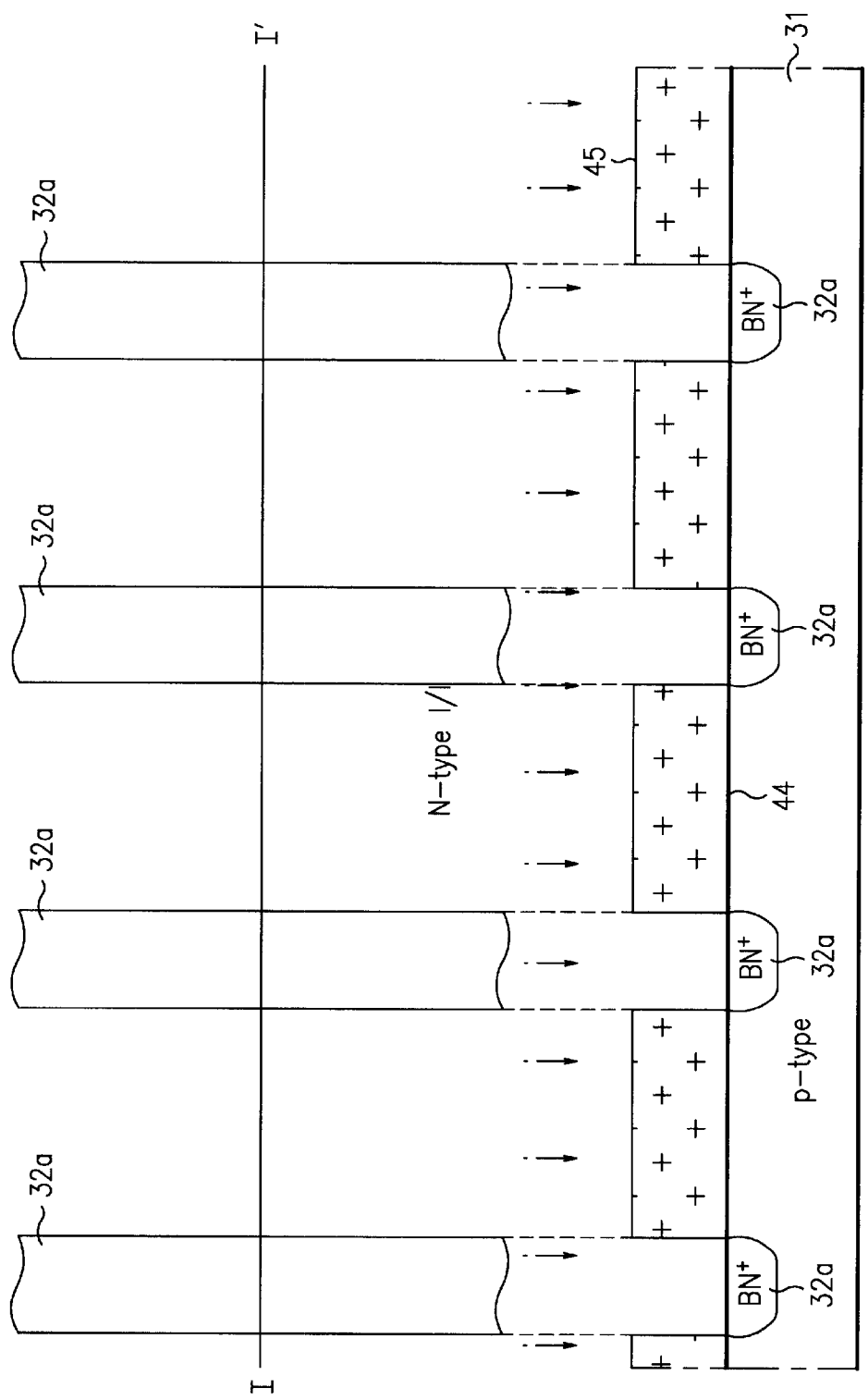

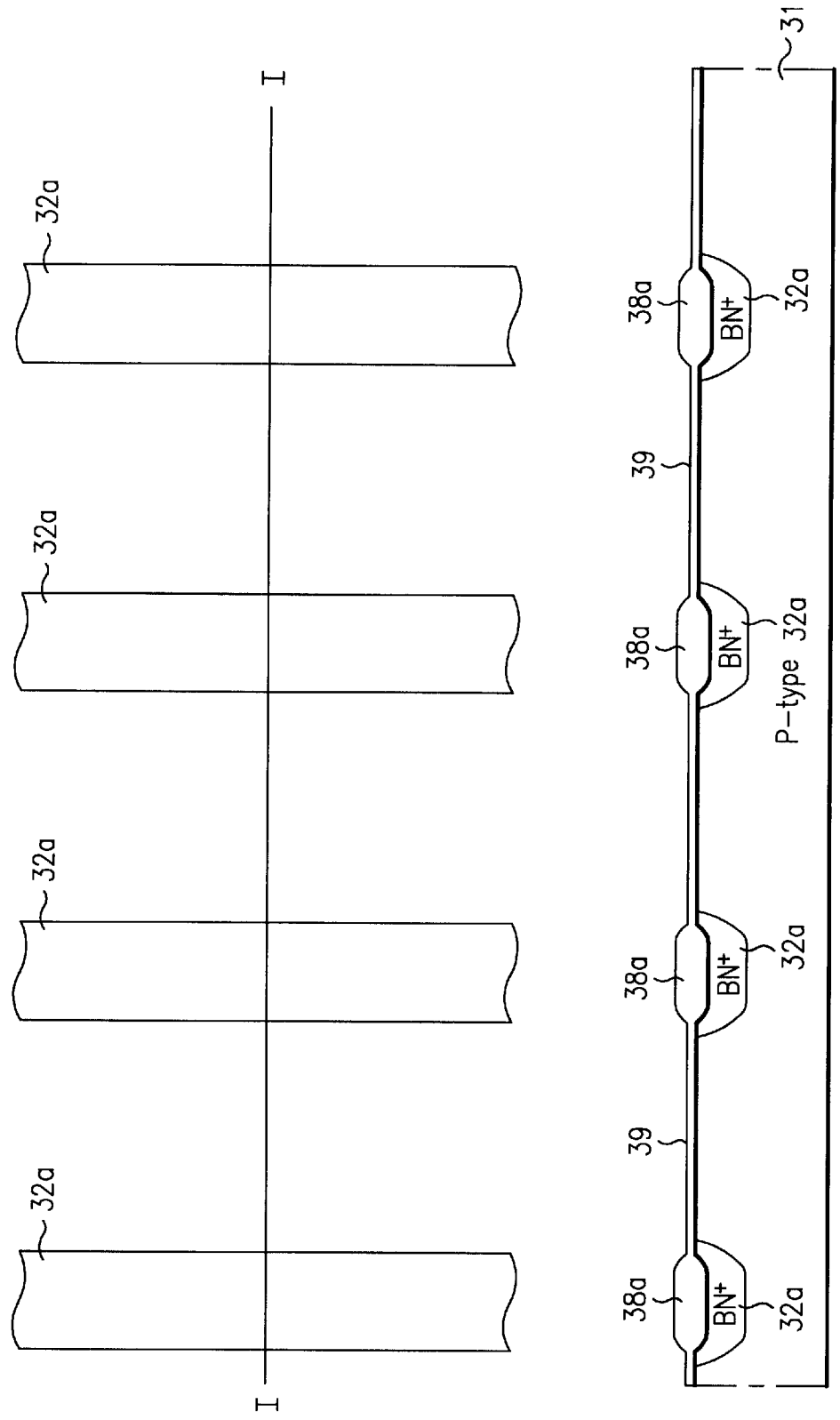

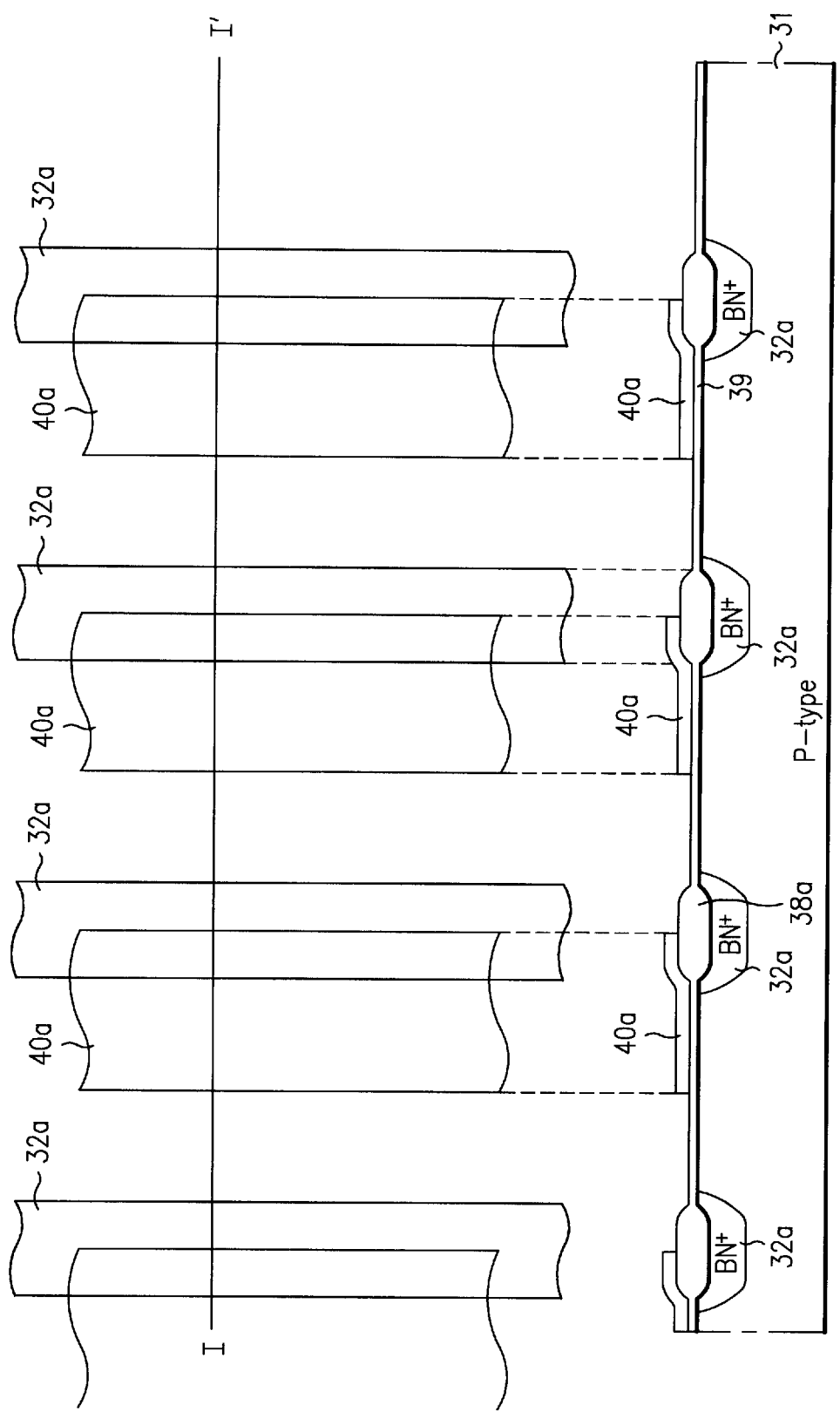

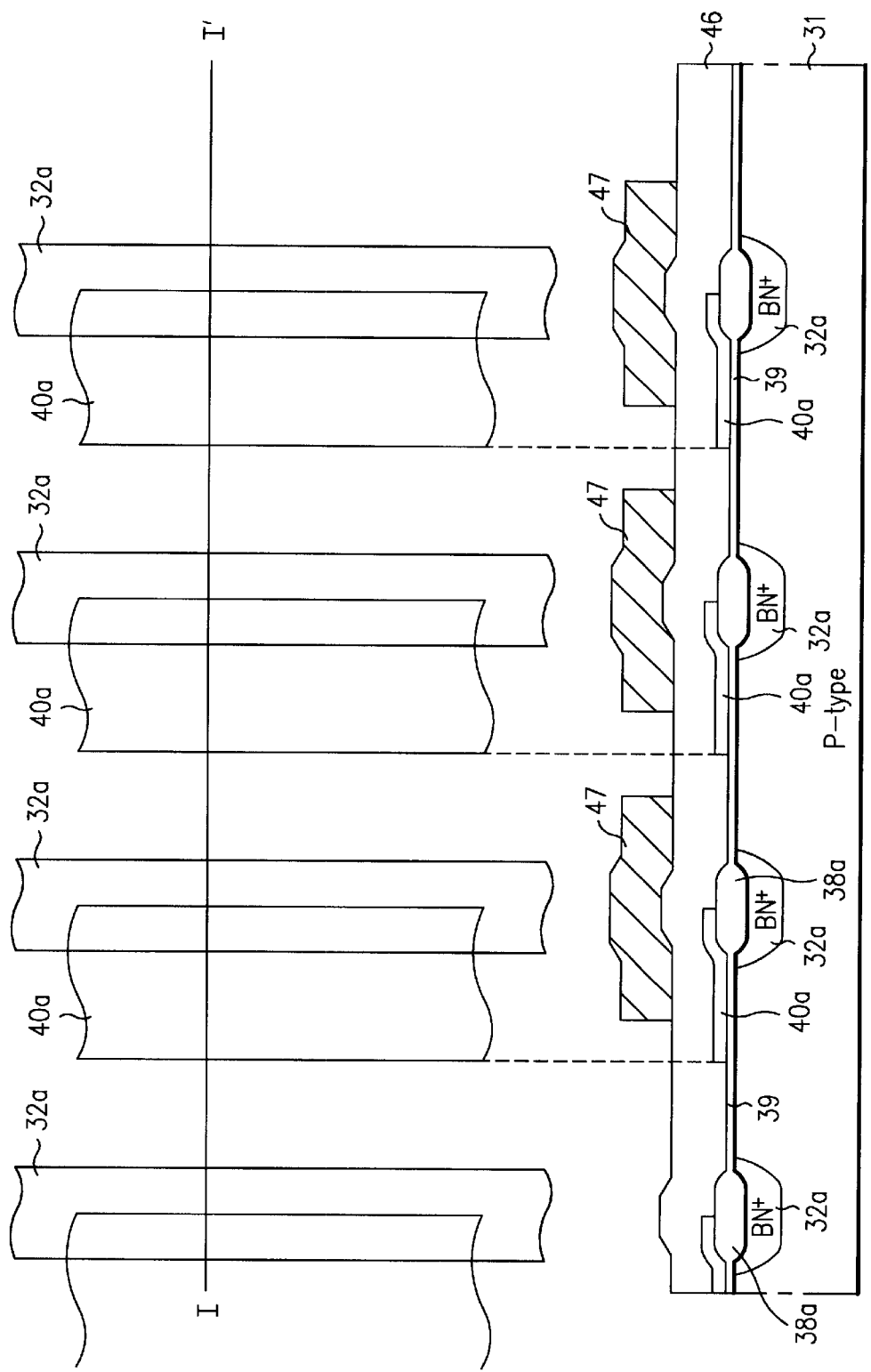

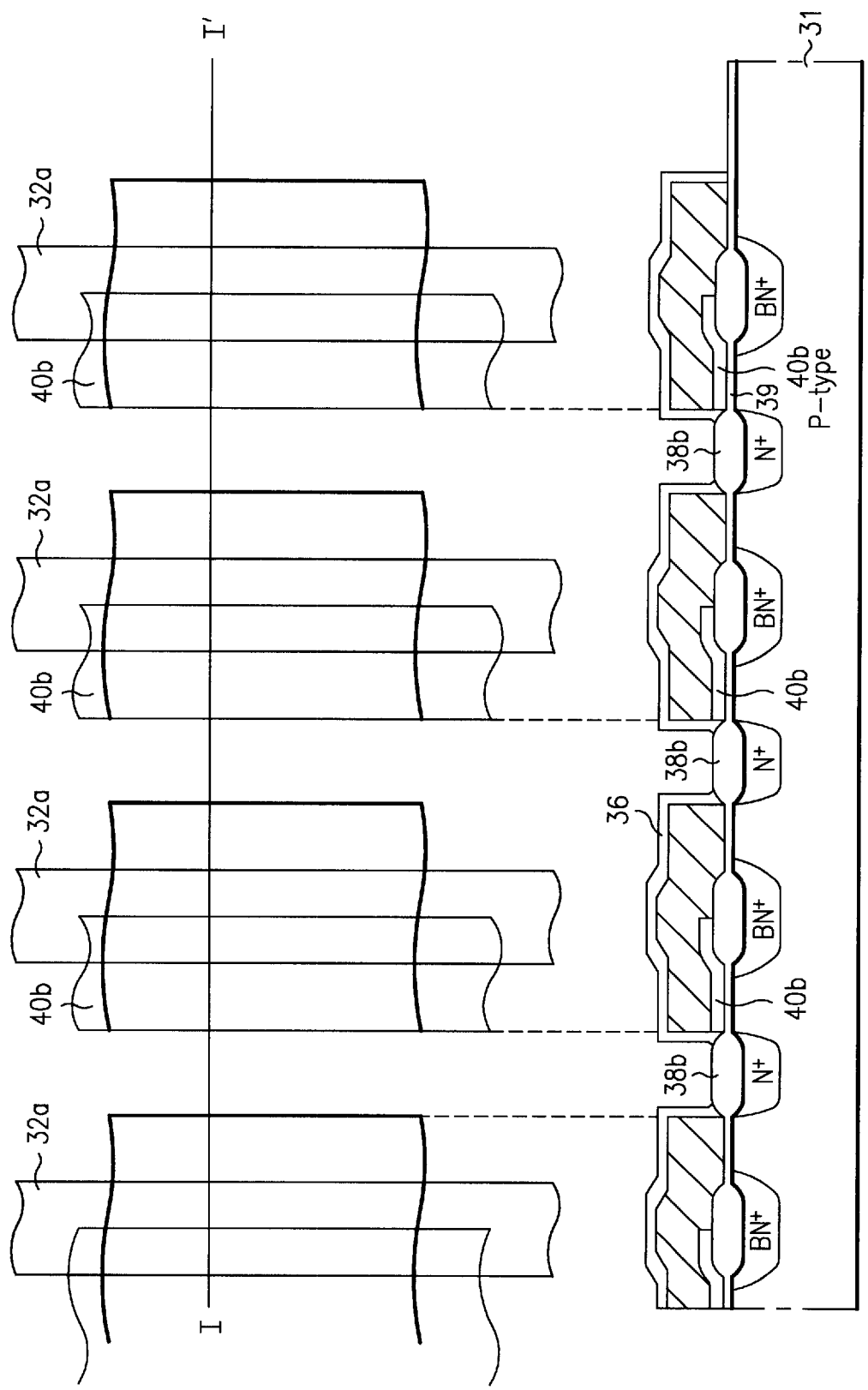

NONVOLATILE SEMICONDUCTOR MEMORY AND METHOD OF FABRICATION

This application is a divisional of Application Ser. No. 09/079,445, filed on May 15, 1998, now U.S. Pat. No. 6,037,226 the entire contents of which are hereby incorporated by reference.

BACKGROUND OF THE INVENTION

1. Field of the Invention

The present invention relates to a nonvolatile semiconductor memory and, more particularly, to a contactless, nonvolatile, metal oxide semiconductor (MOS) memory, and also to a method of fabricating the device.

2. Discussion of the Related Art

The fundamental structure of a conventional nonvolatile MOS memory cell is briefly described below with reference to FIG. 1, a sectional view of a simplified nonvolatile MOS memory cell with a stacked, floating gate configuration. More realistic configurations differ from the simplified configuration of FIG. 1 primarily in the shape and positioning of the gates.

As shown in FIG. 1, thin tunneling (gate) oxide 2 separates conductive floating gate 3 (the term floating gate refers to the fact that no electrical conductor is connected to this gate) and the channel of lightly-doped, p-type semiconductor substrate 1. Thick oxide 4 separates control gate 5 and the floating gate. Heavily-doped, r-type source/drain regions 6 lie within the substrate to either side of the floating gate The nonvolatile MOS memory cell illustrated in FIG. 1 may be viewed as simply a conventional MOS field effect transistor whose gate structure has been modified so as to enable semipermanent charge storage on the gate. The stacked, floating gate configuration is simply one technology by which charge retention on the gate has been realized. The charge stored on the gate gives rise to a threshold voltage shift, so that a nonvolatile, MOS memory with stored charge is at a higher-threshold-voltage state than the device with no stored charge. An impressed gate voltage, ultraviolet light, or some other technology may be used to eliminate the stored charge and return the device to its lower-threshold-voltage state. The charge-transfer mechanism of nonvolatile memory cells whose structures may be illustrated by FIG. 1 is based on tunneling through the thin gate oxide rather than on avalanche injection of hot electrons from the channel to the floating gate.

Nonvolatile MOS memory cells which have a stacked, floating gate configuration are favored for high-density applications due to their characteristically small cell sizes. Absent other changes, any reduction in cell size is necessarily accompanied by a decrease in the capacitive coupling between the control gate and the floating gate. To mitigate this effect of the reduction in cell size, a silicon dioxide/silicon nitride/silicon dioxide (ONO) composite dielectric, which has a higher breakdown voltage than a single oxide film, may be used as the insulator between the floating and control gates. The enhanced inter-gate capacitance due to use of an ONO dielectric comes at the price of the several processing steps, including a high temperature annealing, required to form the ONO sandwich, which result in a higher manufacturing cost and lower device yield per wafer.

Research is also continuing into the use of materials such as tantalum pentoxide, which has a significantly higher dielectric constant than silicon dioxide, as the insulator between the floating and control gates. At present, however, novel memory cell structures, rather than novel materials, appear to offer the most likely way to increase capacitive coupling while reducing effective memory cell size.

Since a conventional stacked, floating gate MOS memory device requires one metal contact for every two cells of the memory cell array, the size of an array of N stacked, floating gate memory cells is significantly greater than N times the size of a single memory cell. So-called contactless, nonvolatile memory cell technologies have been developed to counter this increase in effective cell size. A conventional contactless memory cell is described immediately below with reference to FIG. 2, a plan view of a contactless, nonvolatile MOS memory cell array, and FIG. 3, a sectional view of the device of FIG. 2 along line I–I'.

As shown in FIGS. 2–3, regularly-spaced, parallel pairs of heavily-doped, n-type source/drain regions 12 lie within a lightly-doped, p-type semiconductor substrate 11. A thin, tunneling dielectric film 17, typically a thermal oxide, covers the upper surface of the substrate. Insulating structures 15 isolate the source region of each of the above pairs of heavily-doped regions from the drain region of an adjacent pair of heavily-doped regions, and vice versa.

Regularly spaced, parallel, conductive control gates 13 above the substrate are perpendicular to the heavily-doped source/drain regions 12. Below any given control gate lie a plurality of conductive floating gates 14 on the dielectric film 17, each of which spans the interval between the members of one of the above pairs of source/drain regions. Insulating dielectric film 16 separates any given control gate from the floating gates below that control gate.

The memory device illustrated by FIGS. 2–3 includes a rectangular array of memory cells, each of which includes a single floating-gate, MOS transistor. The cells are interconnected by the control gates 37 extending along the row direction of the array and by the heavily-doped source/drain regions 12 extending along the column direction of the array. Each control gate serves as a word-line of the memory array, since it controls the movement of a bit into or out of the group of memory cells to which it is connected; the heavily-doped drain regions 12 serve as bit-lines of the array, since each transmits that bit to the rest of the system. The heavily-doped drain regions can serve as bit-lines due to their low bulk resistivity, so that metal lines need not be fabricated to serve this function. -More importantly, the use of the heavily-doped drain regions as bit-lines means that a separate metal contact need not be formed to connect each memory cell to a bit-line, which results in a reduced effective memory cell size.

Although the contactless, nonvolatile memory cell array illustrated by FIGS. 2–3 is characterized by a relatively large capacitive coupling between the control gate and the floating gate, the isolating structures 15 which serve to isolate any memory cell in the array from the memory cells adjacent to it significantly increase the effective size of a memory cell.

U.S. Pat. No. 5,047,362, which issued on Sept. 10, 1991 to Albert Bergemont for Method for Making Large-Scale EPROM Memory with a Checker Board Pattern and an Improved Coupling Factor, which is hereby incorporated by reference in its entirety, discloses a contactless, nonvolatile memory which is characterized by relatively large intergate capacitive coupling but which does not employ insulating structures to isolate the memory cells of the array from each other. Such a memory array is described below with reference to FIG. 4, a plan view of the device, and FIG. 5, a sectional view of the device of FIG. 4 along line II–II'.

The nonvolatile memory device illustrated in FIGS. 4–5 comprises a matrix of memory cells interconnected by word-lines extending along the row direction of the matrix and bit-lines extending along the column direction of the matrix. Each memory cell comprises a symmetrical pair of floating-gate, MOS field effect transistors of the same row that share a common drain. Each of the two sources of a given memory cell is in turn shared with a transistor of an adjacent memory cell of the same row.

The memory cells are interconnected by the control gates 13 (word-lines) extending in the row direction of the matrix and by the heavily-doped drain regions 12*b* (bit-lines) extending along the column direction of the matrix. Heavily doped regions 12*a* and 12*c* adjacent to the heavily-doped region 12*b* between them serve as source regions. Regularly-spaced, parallel triplets of heavily-doped, n-type source/drain regions 12*a*, 12*b*, and 12*c* lie within lightly-doped, p-type semiconductor substrate 11. Thin tunneling oxide 17 covers the upper surface of the substrate.

Regularly-spaced, conductive first floating gates 14*a*, perpendicular to the heavily-doped regions 12, lie on the thin tunneling oxide and span the interval between the members of each pair of adjacent, heavily doped regions 12*a* and 12*b*. Regularly-spaced, conductive first floating gates 14*b*, perpendicular to the heavily-doped regions 12, lie on the tunneling oxide and span the interval between the members of each pair of adjacent, heavily-doped regions 12*b* and 12*c*. Each first floating gate 14*b* which lies above a given heavily-doped region 12*b* is aligned with a first floating gate 14*a* which also lies above that heavily-doped region 12*b*, and vice versa. An insulating spacer 18 on tunneling oxide film 17 lies between each pair of aligned first floating gates 14*a*–14*b*.

A second floating gate 14*c*, perpendicular to the heavily-doped regions 12, lies on each pair of aligned first floating gates 14*a*–14*b* and on the insulating spacer 18 between the members of that pair of aligned first floating gates and is electrically connected to both members of the pair of first floating gates 14*a*–14*b*.

Regularly-spaced, parallel, conductive control gates 13, also perpendicular to the heavily-doped regions 12, lie on dielectric film 16, which covers the upper and lateral surfaces of second floating gates 14*c*. Below any given control gate 13 lie a plurality of second floating gates 14*c*. Each second floating gate 14*c* serves to increase the capacitive coupling between the first floating gates 14*a* and 14*b* below it and the control gate 13 above it.

Although the symmetric gate structure of the contactless, nonvolatile MOS memory device illustrated by FIGS. 4–5 does effectuate enhanced capacitive coupling between first floating gates 14*a* and 14*b* and the control gate 13 above them, any pair of first floating gates 14*a* and 14*b* share tunneling insulating film 17 with other pairs of first floating gates and are thereby coupled to them.

SUMMARY OF THE INVENTION

The nonvolatile, contactless MOS memory device of the present invention comprises a matrix of memory cells interconnected by word-lines in the row direction of the matrix and bit-lines in the column direction of the matrix. Each memory cell comprises an asymmetrical pair of floating-gate, MOS field effect transistors of the same row that share a common source region (bit-line) extending along the column direction within a semiconductor substrate. Each of the two drain regions to either side of the common source region of a given memory cell is in turn shared with a transistor of an adjacent memory cell of the same row. The novel asymmetry of the gate structure of the two transistors of a memory cell enables monitoring and programming/reading of the cell to be accomplished simultaneously. The structure of the floating gates is also responsible for the relatively large capacitive coupling between the floating gate of a memory cell and the control gate (word-line) which lies above it. Since the floating gates essentially serve as a mask during formation of the drain regions within the substrate, the fabrication process incorporates self-aligning process steps. The invention also provides a method for making such a memory device.

The invention also provides a nonvolatile semiconductor memory cell and the corresponding method of making, the cell comprising: a semiconductor substrate of a first conductivity type; a common source region of a second conductivity type in a first direction within the substrate; a first drain region and a second drain region of the second conductivity type in the first direction within the substrate a fixed distance to either side of the common source region; an insulating film on the substrate; an insulating island on the insulating film both above the common source region and to a side of the common source region nearest the second drain region; a conductive first floating gate on the insulating film to a side of the common source region nearest the first drain region, the first floating gate contiguous to the insulating island; a conductive second floating gate on the first floating gate and also on the insulating island; a dielectric film on exposed surfaces of both the first and second floating gates; and a conductive control gate in a second direction on the dielectric film on the second floating gate.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

None of the figures briefly described below are drawn to scale. As is common in the art of integrated circuit representation, the thicknesses and lateral dimensions of the various layers shown in the figures were chosen only to enhance the legibility of the figures.

The present invention will become more fully understood from the detailed description given hereinbelow and the accompanying drawings which are given by way of illustration only, and thus are not limitative of the present invention and wherein.

FIGS. 13A–13I are idealized plan and sectional views illustrating process steps of a method of fabricating a nonvolatile memory device according to an embodiment of the present invention;

FIGS. 16A–16G are plan and sectional views illustrating process steps of a method of fabricating a nonvolatile memory device according to an embodiment of the present invention.

DETAILED DESCRIPTION OF THE PREFERRED EMBODIMENTS

The structure of a nonvolatile semiconductor memory device according to the present invention is described immediately below with reference to FIGS. 6–8 and 14–15.

Figure 1:
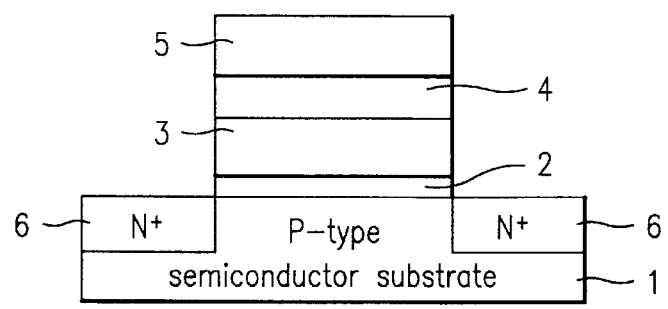
FIG. 1 is an idealized sectional view of a memory cell of a conventional nonvolatile MOS memory device.
Figure 2:
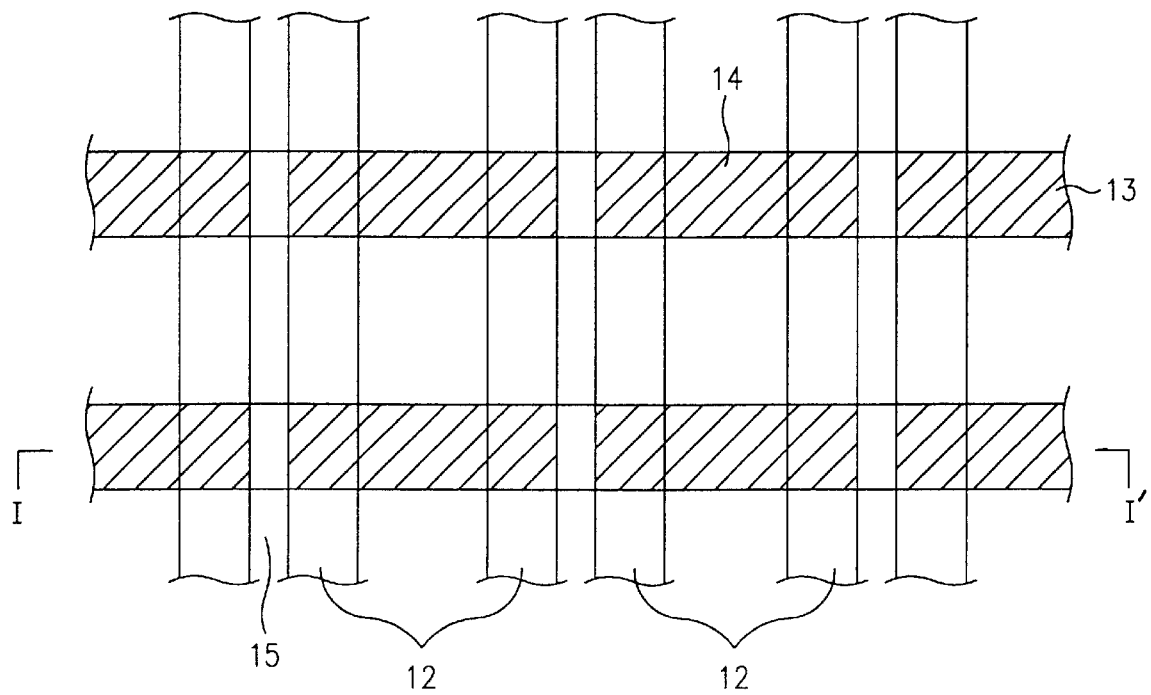
FIG. 2 is an idealized plan view of a conventional contactless, nonvolatile MOS memory device.
Figure 3:
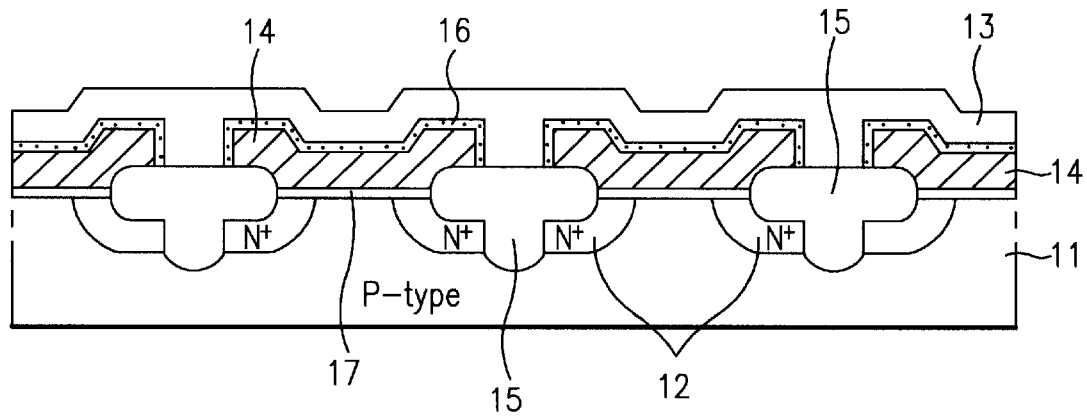
FIG. 3 is a sectional view of the device of FIG. 2 along line I–I'.
Figure 4:
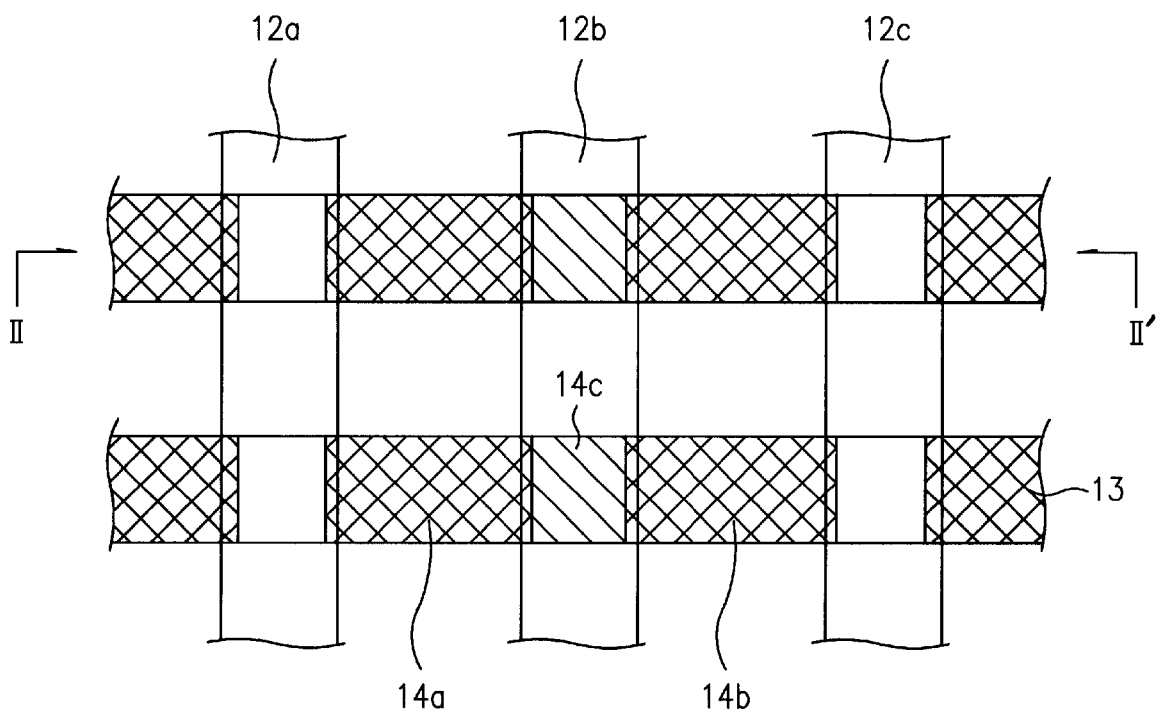
FIG. 4 is an idealized plan view of a prior art contactless, nonvolatile MOS memory device whose structure results in enhanced inter-gate capacitive coupling.
Figure 5:
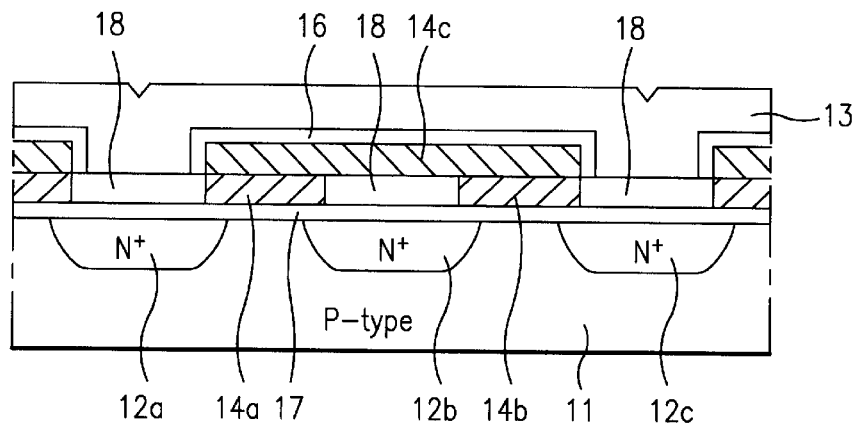
FIG. 5 is a sectional view of the device of FIG. 4 along line II–II'.
Figure 6:
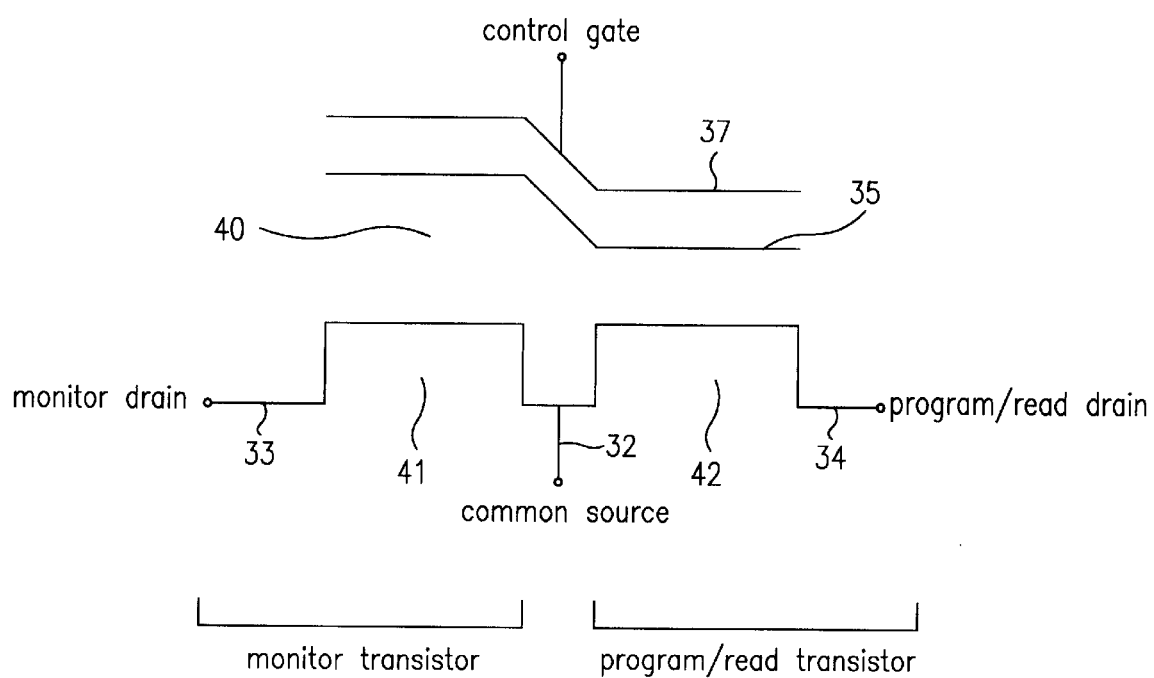
FIG. 6 is a circuit diagram of a memory cell of a nonvolatile semiconductor memory device according to an embodiment of the present invention.

The nonvolatile memory device of the present invention comprises a matrix of memory cells electrically interconnected by conductive word-lines extending along the row direction of the matrix and conductive bit-lines extending along the column direction of the matrix as shown in FIG. 6, each memory cell comprises an asymmetrical pair of floating-gate, MOS field effect transistors of the same row that share a common source 32a. Each of the two drains 32b of a given memory cell is in turn shared with a transistor of an adjacent memory cell of the same row—one serves as the drain of the MOSFET used to monitor the state of the memory cell, while the other serves as the drain of the MOSFET used to program and read the state of the memory cell.

Figure 7:
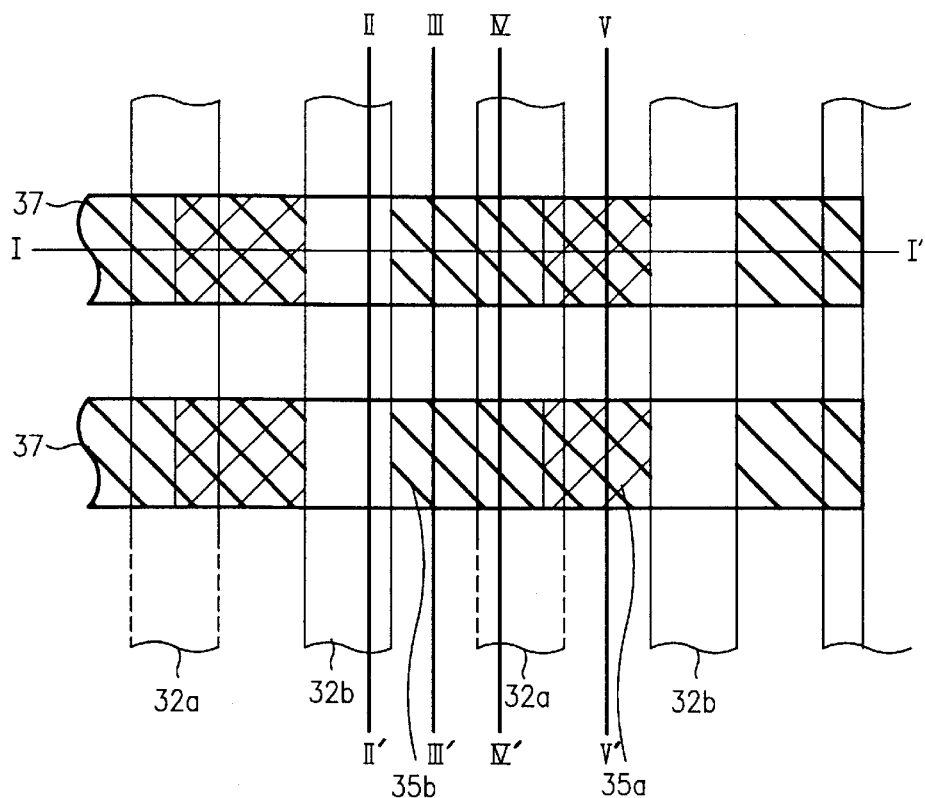
FIG. 7 is an idealized plan view of a nonvolatile semiconductor memory device according to an embodiment of the present invention.
Figure 8:
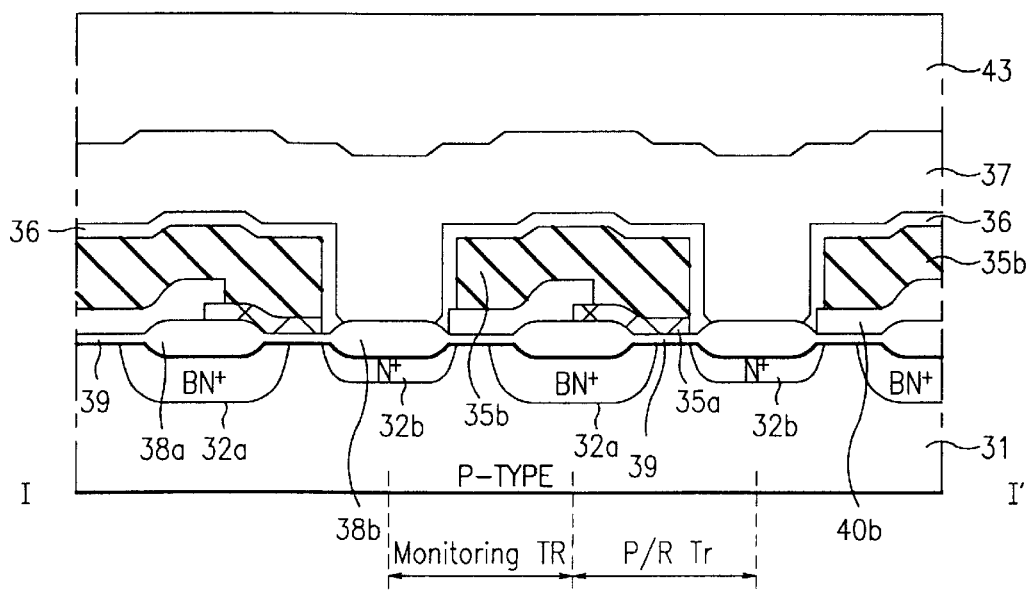
FIG. 8 is a sectional view of the device of FIG. 7 along line I–I'.
Figure 9:
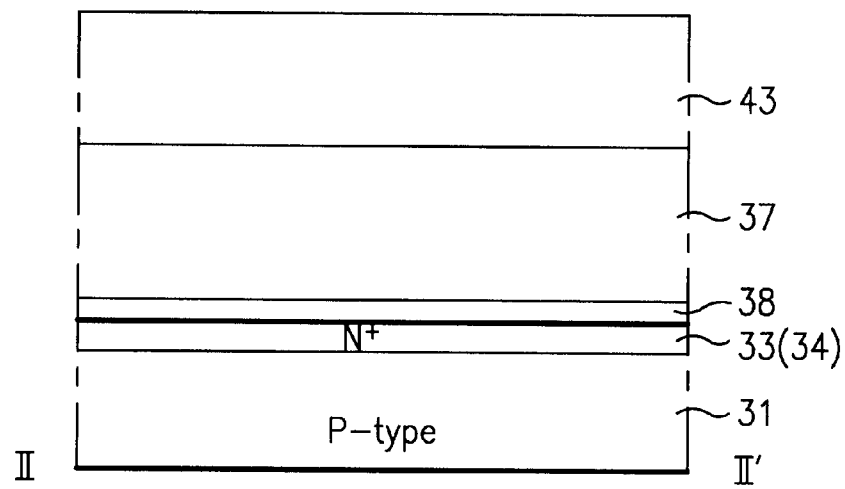
FIG. 9 is a sectional view of the device of FIG. 7 along line II–II'.
Figure 10:
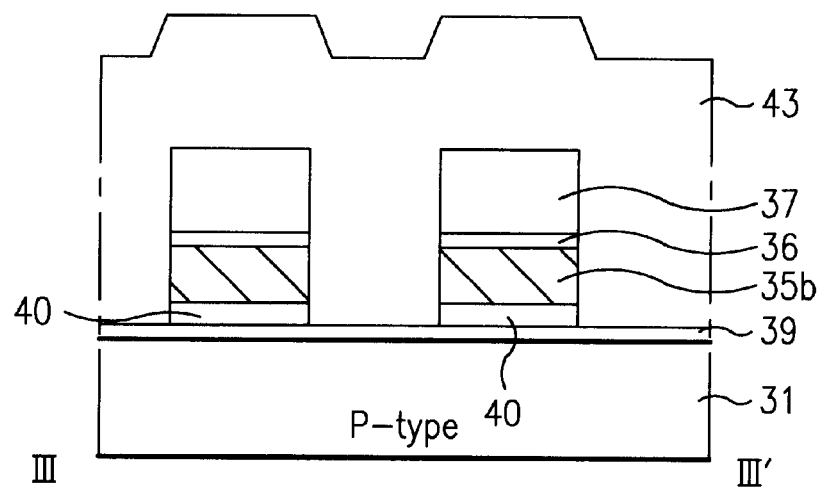
FIG. 10 is a sectional view of the device of FIG. 7 along line III–III'.
Figure 11:
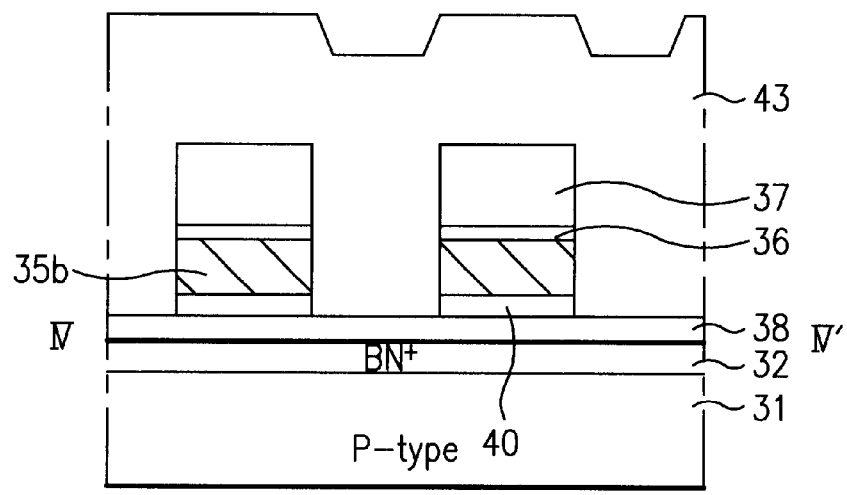
FIG. 11 is a sectional view of the device of FIG. 7 along line IV–IV'.
Figure 12:
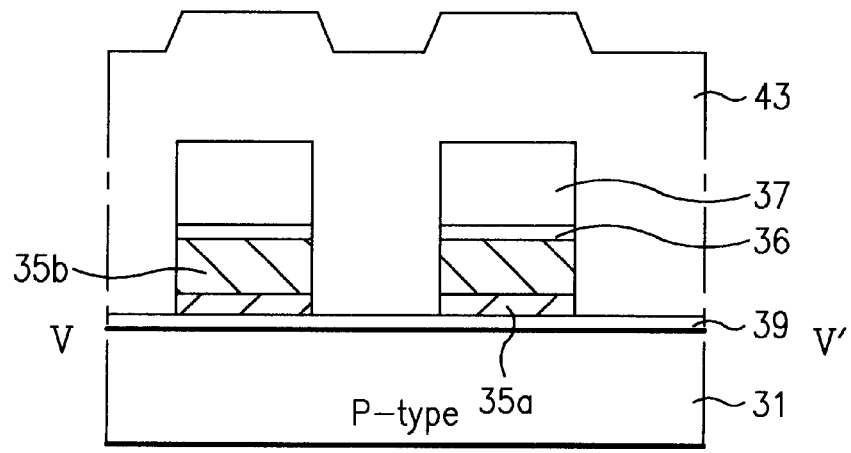
FIG. 12 is a sectional view of the device of FIG. 7 along line V–V'.
Figure 14:
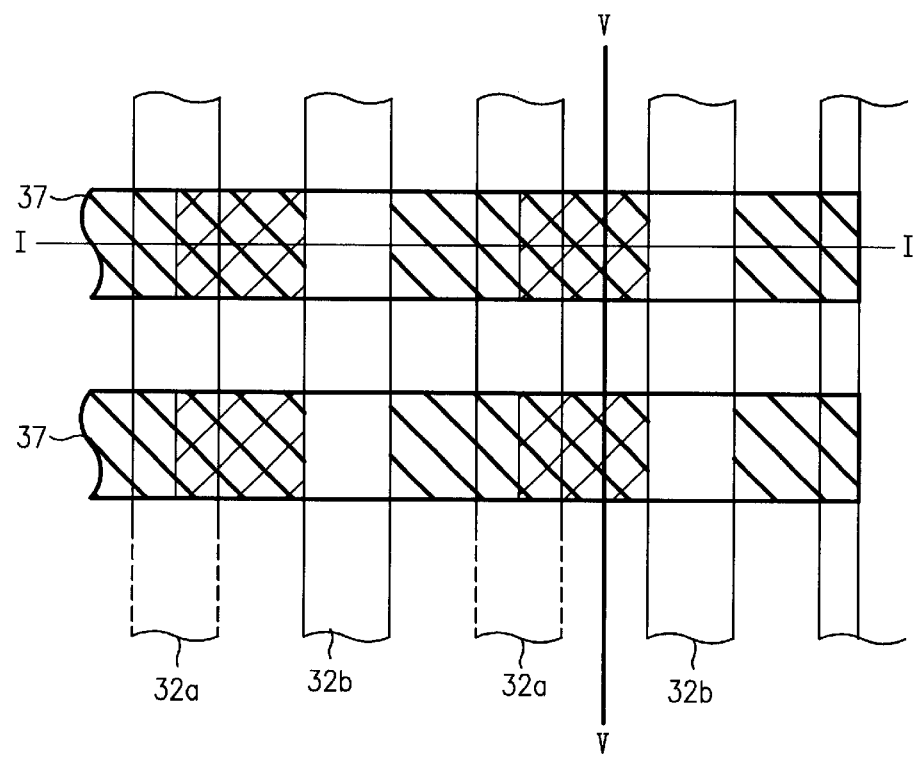
FIG. 14 is an idealized plan view of a nonvolatile semiconductor memory device according to an embodiment of the present invention.
Figure 15:
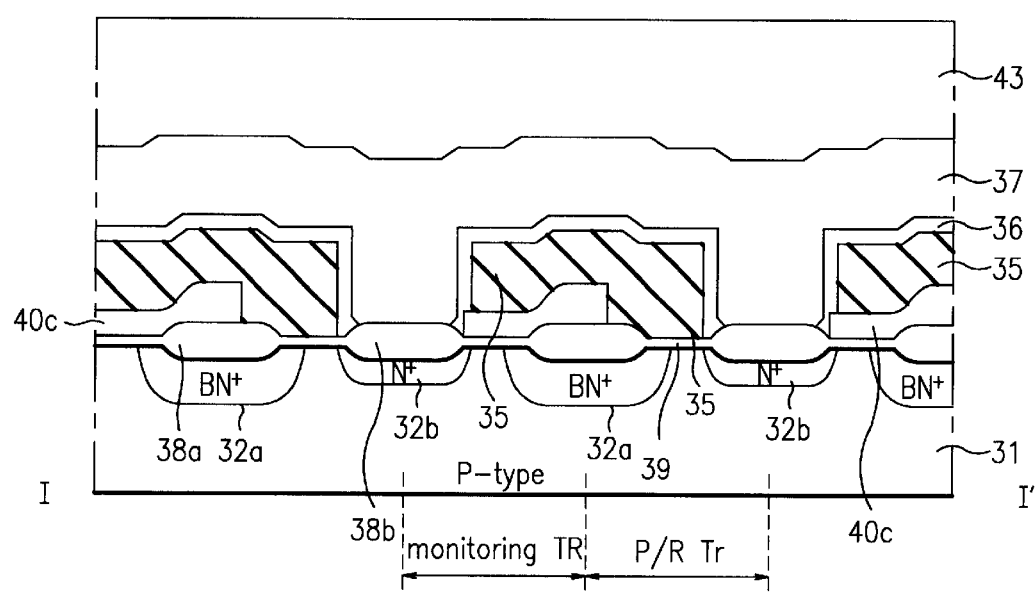
FIG. 15 is a sectional view of the device of FIG. 14 along line I–I'.

According to both a first embodiment of the present invention, as illustrated in FIGS. 7–8, and a second embodiment of the present invention, as illustrated in FIGS. 14–15, a plurality of regularly-spaced, heavily-doped n-type common source regions 32a lie in the column direction within lightly-doped, p-type semiconductor substrate 31 and serve as the bit-lines of the memory cell array. Each common source region has a first side and a second side in the row direction. A pair of heavily-doped, n-type drain regions 32b lie in the column direction within the substrate a fixed distance to either side of and adjacent to any given common source region—a monitor drain region to the first side oL the given common source region and a program/read drain region to the second side of the given common source region. Each drain region is substantially equidistant from the common source regions adjacent to it to either side.

As illustrated in both FIG. 8 and FIG. 15, a thick, isolating oxide strip 38a lies on the upper surface of the substrate above each of the common source regions 32a; a thick, isolating, oxide strip 38b lies on the upper surface of the substrate above each of the drain regions 32b; and a thin, tunneling, (gate) oxide strip 39 completely covers the upper surface of the substrate between the members of each pair of adjacent isolating strips. Alternating, contiguous, isolating and tunneling strips thus together completely cover the upper surface of the substrate. (Adjacent and contiguous both denote being in close proximity. Adjacent may or may not imply contact, but always implies absence of anything of the same kind in between, while contiguous implies contact on all or most of one side.)

According to the first embodiment of the present invention, as illustrated in FIG. 8, a plurality of regularly-spaced, first golysilicon floating gates 35a lie above any given common source region 32a. Each of these first floating gates lies partially on an isolating strip 38a above the given common source region 32a. Each also lies partially on a tunneling strip 39 to the first side of and contiguous to that isolating strip 38a. Each also extends to the edge of, but does not lie on, the isolating strip 38b which lies to the first side of and adjacent to the given common source region 32a.

As illustrated in FIG. 8, a plurality of regularly-spaced, insulating islands 40b also lie above any given common source region 32a. There is an insulating island for each first floating gate above a common source region. Each of these insulating islands lies partially on the isolating strip 38a and partially on the tunneling strip 39 to the second side of and contiguous to that isolating strip. Each insulating island 40b also extends to the edge of, but does not lie on, the isolating strip 38b which lies to the second side of and adjacent to the given common source region 32a.

There is a one-to-one correspondence between first polysilicon gates 35a and insulating islands 40b. Each insulating island 40b that lies above a given common source region 32a is both aligned with and contiguous to a first polysilicon floating gate 35a that also lies above that common source region; each first polvsilicon floating gate 35a that lies above a given common source region 32a is aligned with and contiguous to an insulating island 40b that also lies above that common source region. Each insulating island 40b partially overlaps and is at least as thick as the first polysilicon floating gate 35a with which it is aligned and to which it is contiguous.

As illustrated in FIG. 8, a second polysilicon floating gate 35b lies on the upper surface of each first floating gate 35a and on the upper surface of the insulating island 40b contiguous to that first floating gate. Each second floating gate 35b is electrically connected to the first floating gate 35a on which it lies.

A dielectric film 36 covers the exposed surfaces of each second floating gate 35b. A plurality of regularly-spaced, conductive control gates 37 lie along the row direction on dielectric film 36, each control gate lying over a plurality of second floating gates 35b aligned along a row of the memory cell matrix and serving as the word-line for the cells of that row of the matrix. Control gates 37 are insulated by protective film 43.

As shown in FIGS. 6 and 8, each monitor transistor includes a second floating gate 35b, a monitor drain region 32b, and a common source region 32a and each program/read transistor includes a first floating gate 35a, a program/read drain region 32b, and a common source region 32a. As mentioned briefly above, the program/read transistor performs programming and reading operations for a memory cell, and the monitor transistor performs verification during programming of the memory cell. Since each second floating gate 35b is electrically connected to a first floating gate 35a, these first and second floating gates comprise an equipotential surface during charge storage. Due to the different gate structures of the two transistors that comprise a memory cell, the shift in threshold voltage of the monitor transistor caused by charge storage on floating gate 35b is different from the shift in threshold voltage of the program/read transistor caused by charge storage on floating gate 35a. This asymmetry enables simultaneous monitoring and programming/reading of the memory cell.

According to the second embodiment of the present invention, as illustrated in FIGS. 14–15, a plurality of regularly-spaced, insulating islands 40c lie above the common source regions 32a. Each of these insulating islands lies partially on the isolating strip 38a and partially on the tunneling strip 39 to the second side of and contiguous to that isolating strip 38a. Each insulating island 40c also extends to the edge of, but does not lie on, the isolating strip 38b which lies to the second side of and adjacent to the given common source region 32a.

As illustrated in FIG. 15, a plurality of regularly-spaced, polysilicon floating gates 35 also lie above the common source regions 32a. A floating gates 35c partially lies on the upper surface of each of the insulating islands 40c, partially on the isolating strip 38a and partially on the tunneling strip 39 to the first side of and contiguous to that isolating strip; and extends to the edge of, but does not lie on, the isolating strip 38b which lies to the first side of and adjacent to the given common source region 32a.

There is a one-to-one correspondence between the polysilicon floating gates 35c and insulating islands 40c. Each insulating island 40c that lies above a given common source region 32a is aligned with and contiguous to a polysilicon floating gate 35c that also lies above that common source region; each polysilicon floating gate 35c that lies above a given common source region 32a is aligned with and contiguous to an insulating island 40c that also lies above that common source region.

A dielectric film 36 covers the exposed surfaces of each floating gate 35c. A plurality of regularly-spaced, conductive control gates 37 extend along the row direction on dielectric film 36, each control gate extending over a plurality of floating gates 35c aligned along a row of the memory cell matrix and serving as the word-line for the cells of that row of the matrix. Control gates 37 are covered by protective film 43.

Process steps involved in the fabrication oL the nonvolatile semiconductor memory device according to the first embodiment of the present invention are described immediately below with reference to FIGS. 13A–13I.

After thermal oxide film 44 has been grown on the upper surface of lightly-doped, p-type semiconductor substrate 31, the thermal oxide film is coated with a layer of photoresist. As shown in FIG. 13A, the photoresist is then selectively removed from the substrate by conventional exposure and development processes and n-type dopants are implanted into the substrate, masked by photoresist pattern 45, to form a plurality of regularly-spaced, heavily-doped n-type common source regions 32a lying along the column direction within the substrate. Each common source region has a first side and a second side along the row direction.

After the remaining photoresist and thermal oxide have been removed, a thick, isolating, oxide strip 38a is grown on the upper surface of the substrate above each of the common source regions 32a and a thin, tunneling, (gate) oxide strip 39 is grown on the upper surface of the substrate to completely cover the upper surface of the substrate between the members of each pair of adjacent isolating strips, as shown in FIG. 13B. Alternating, contiguous, isolating and tunneling strips thus together completely cover the upper surface of the substrate.

Figure 13C:
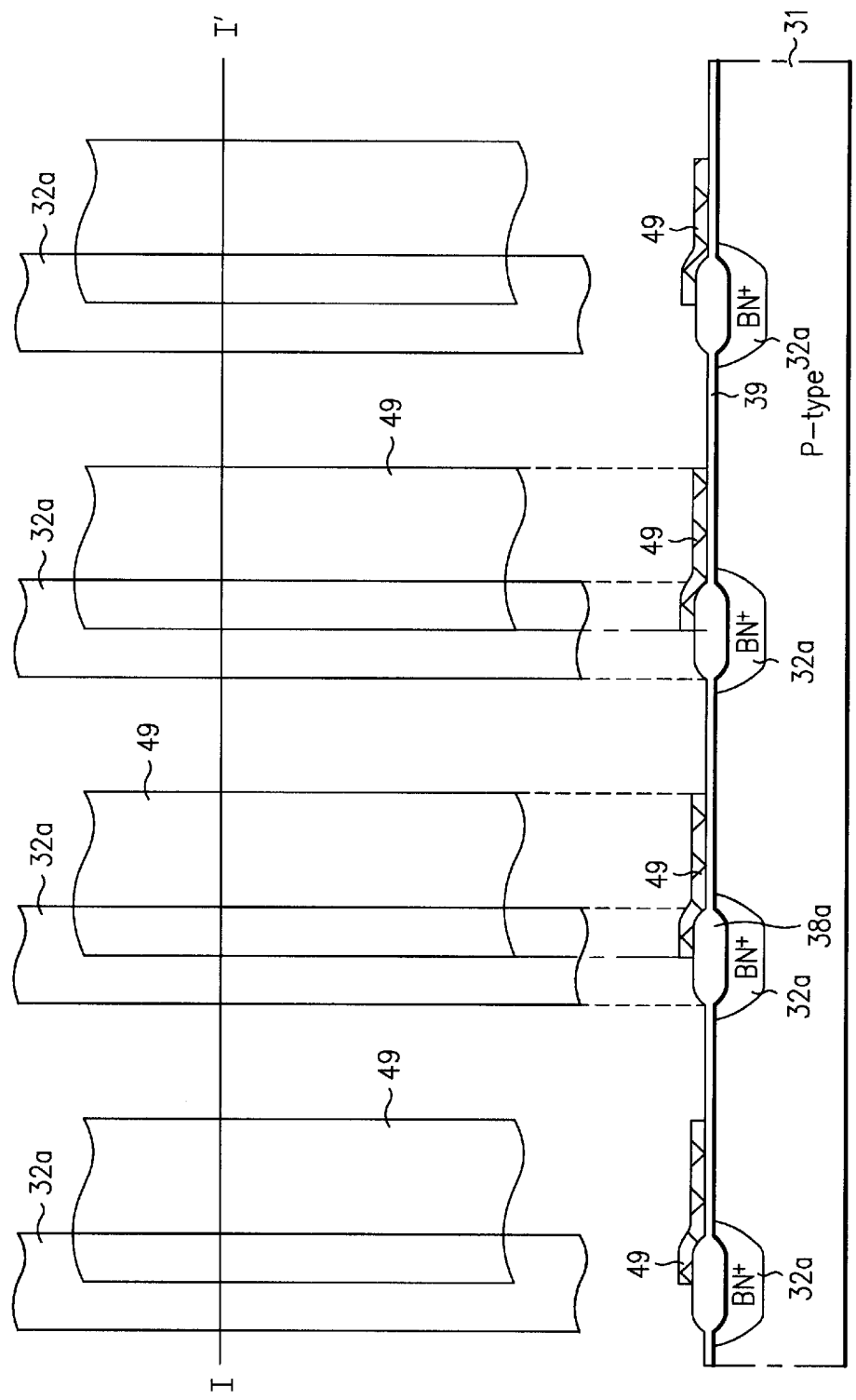

A first polysilicon layer is deposited over the upper surface of the substrate. As shown in FIG. 13C, regions of the first polysilicon layer are removed by conventional processes in order to form a plurality of regularly-spaced first polysilicon strips 49 extending along the column direction, a first polysilicon strip 49 corresponding to each of the common source regions 32a. One of the two edges of the first polysilicon strip 49 that corresponds to a given common source region 32a lies on the isolating strip 38a above the given common source region. The other edge of the first polysilicon strip 49 lies on the tunneling strip 39 contiguous to and to the first side of the isolating strip 38a.

Figure 13D:
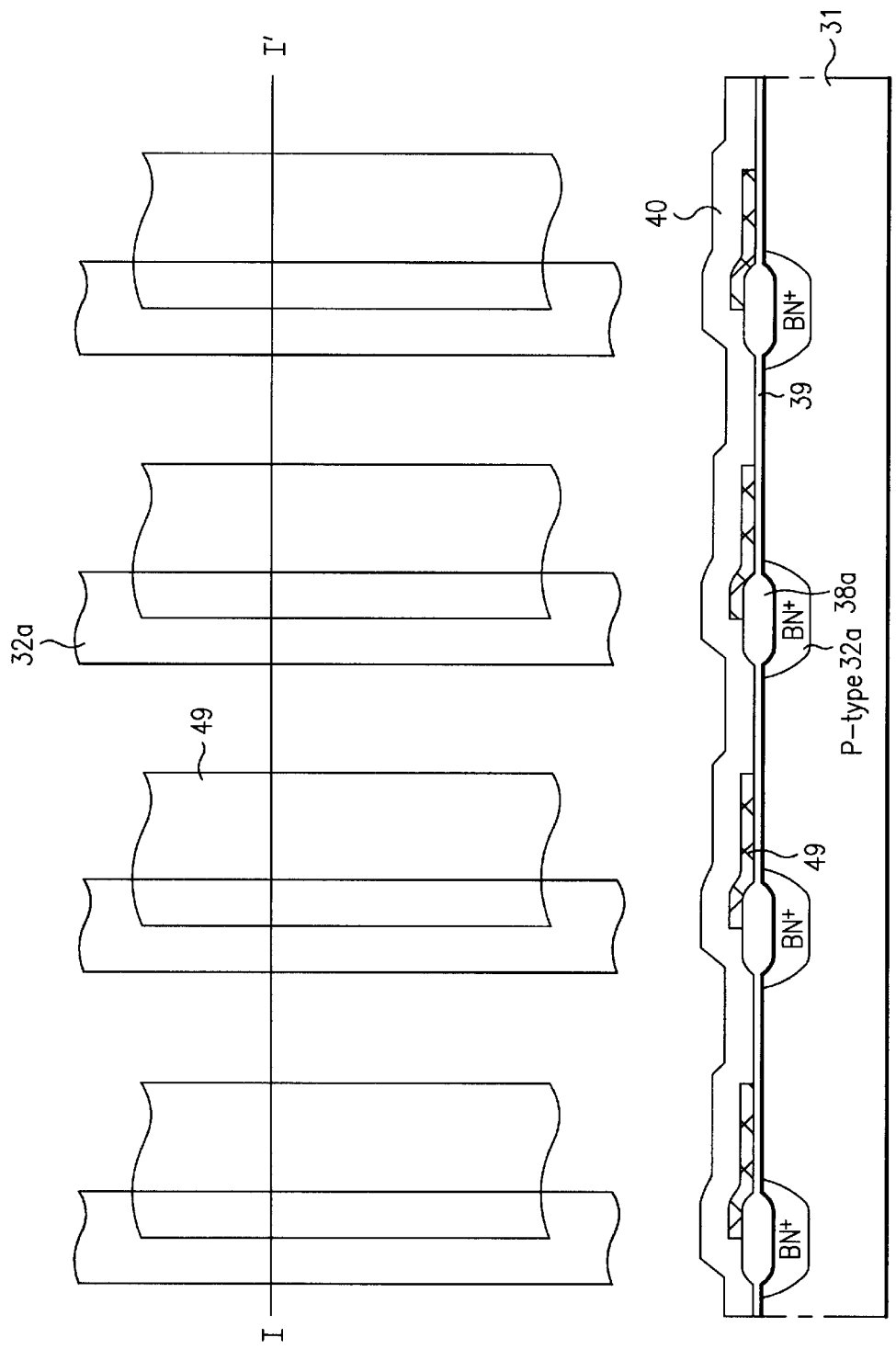

As shown in FIG. 13D, insulating layer 40 is deposited over the upper surface of the substrate. As shown in FIG. 13E, regions of insulating layer 40 are then selectively removed by conventional processes in order to form a plurality of regularly spaced, insulating strips 40a extending along the column direction. Insulating strips 40a are located between the members of each pair of adjacent first, polysilicon strips 49 and overlap both of these first polysilicon strips.

Figure 13F:
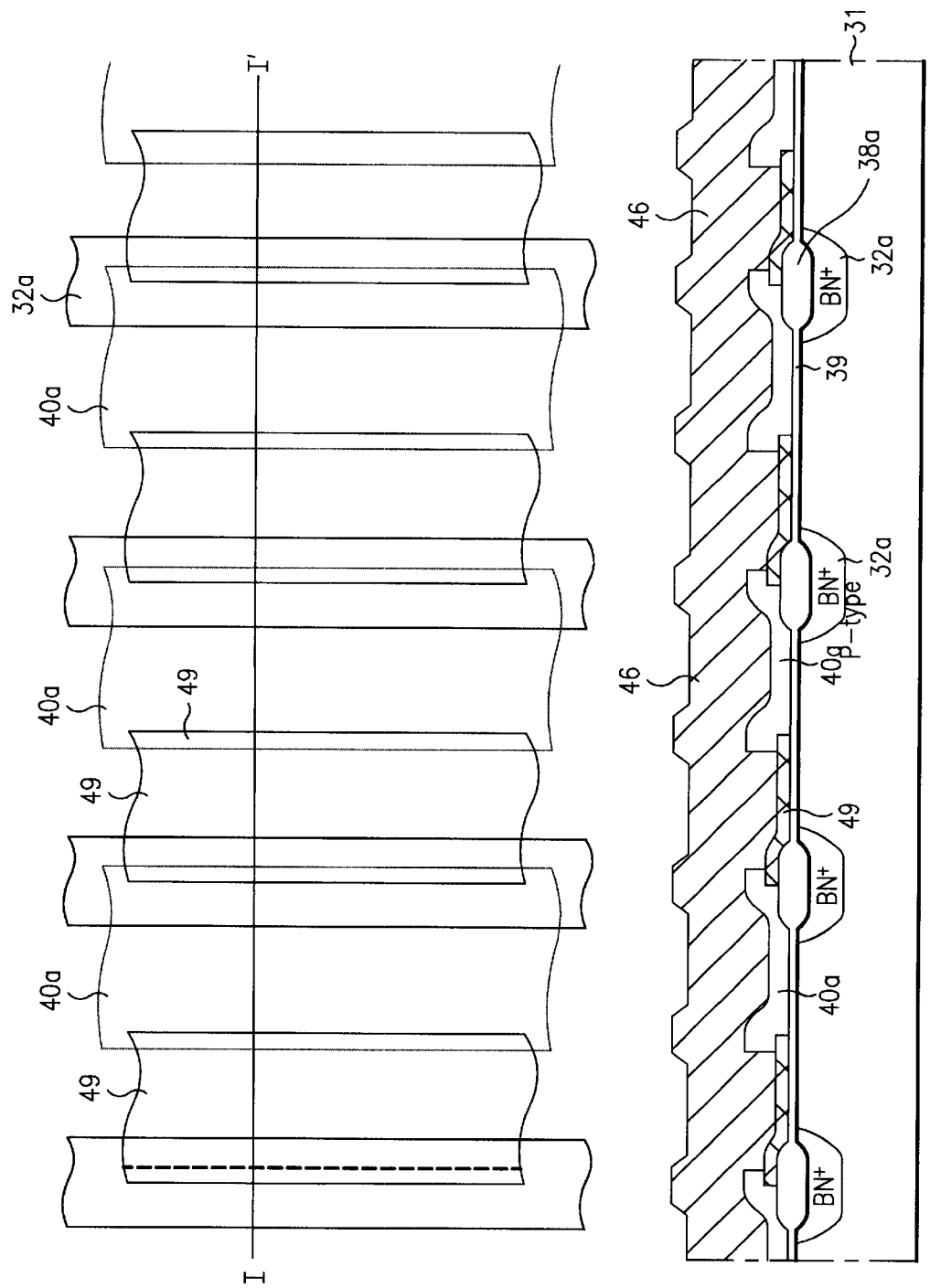

After a second polysilicon layer 46 has been deposited on the exposed surfaces, as shown in FIG. 13F. The second polysilicon layer 46 and first polysilicon strips 49 are electrically connected.

After second polysilicon layer 46 has been coated with a layer of photoresist, photoresist is selectively removed by conventional exposure and development processes in order to form photoresist pattern 47. Regions of second polysilicon layer 46, insulating strips 40a, and first polysilicon strips 49 are selectively removed by means of conventional processes (thereby forming a plurality of regularly-spaced second polysilicon strips 46a, insulating strips 40b, and first polysilicon strips 49a, respectively, all extending along the column direction) in order to expose a plurality of regularly-spaced regions extending along the column direction on the tunneling strips 39. Masked by photoresist pattern 47, n-type dopants are then implanted into the substrate in order to form a pair of heavily-doped, n-type drain regions 32b extending along the column direction within the substrate a fixed distance to either side of and adjacent to each common source region 32a. Each drain region 32b is substantially equidistant from the common source regions 32a adjacent to it. The photoresist remaining on the wafer is removed after the drain regions 32b have been formed.

Figure 13H:
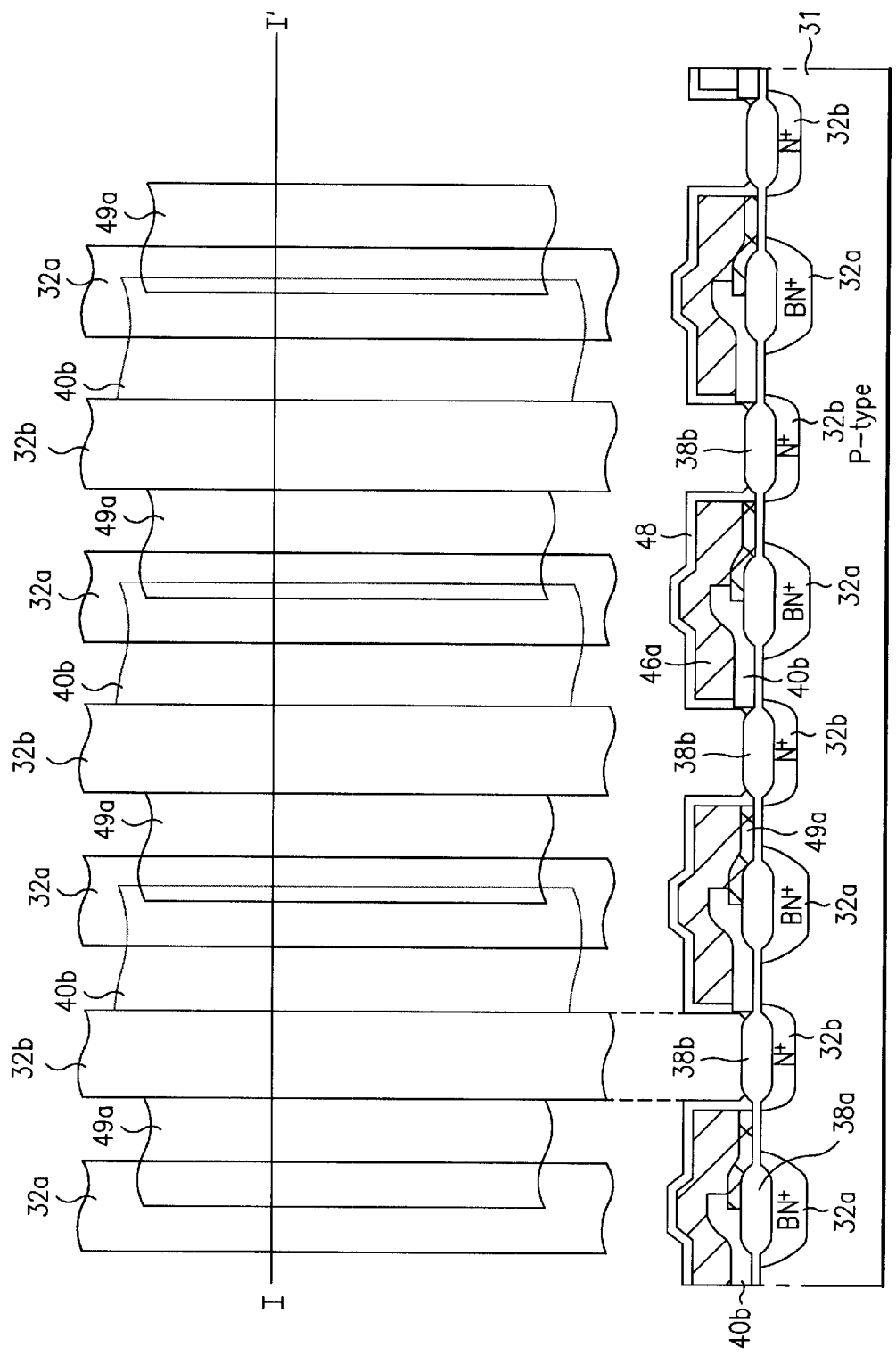

As shown in FIG. 13H, a thick, isolating, oxide strip 38b is grown above each of the newly implanted drain regions 32b and dielectric films 36 are formed on the exposed surfaces of the second polysilicon strips 46a and on the exposed lateral surfaces of the first polysilicon strips 49a. The dielectric films 36 preferably are formed of either a thermal oxide or ONO.

Figure 13I:
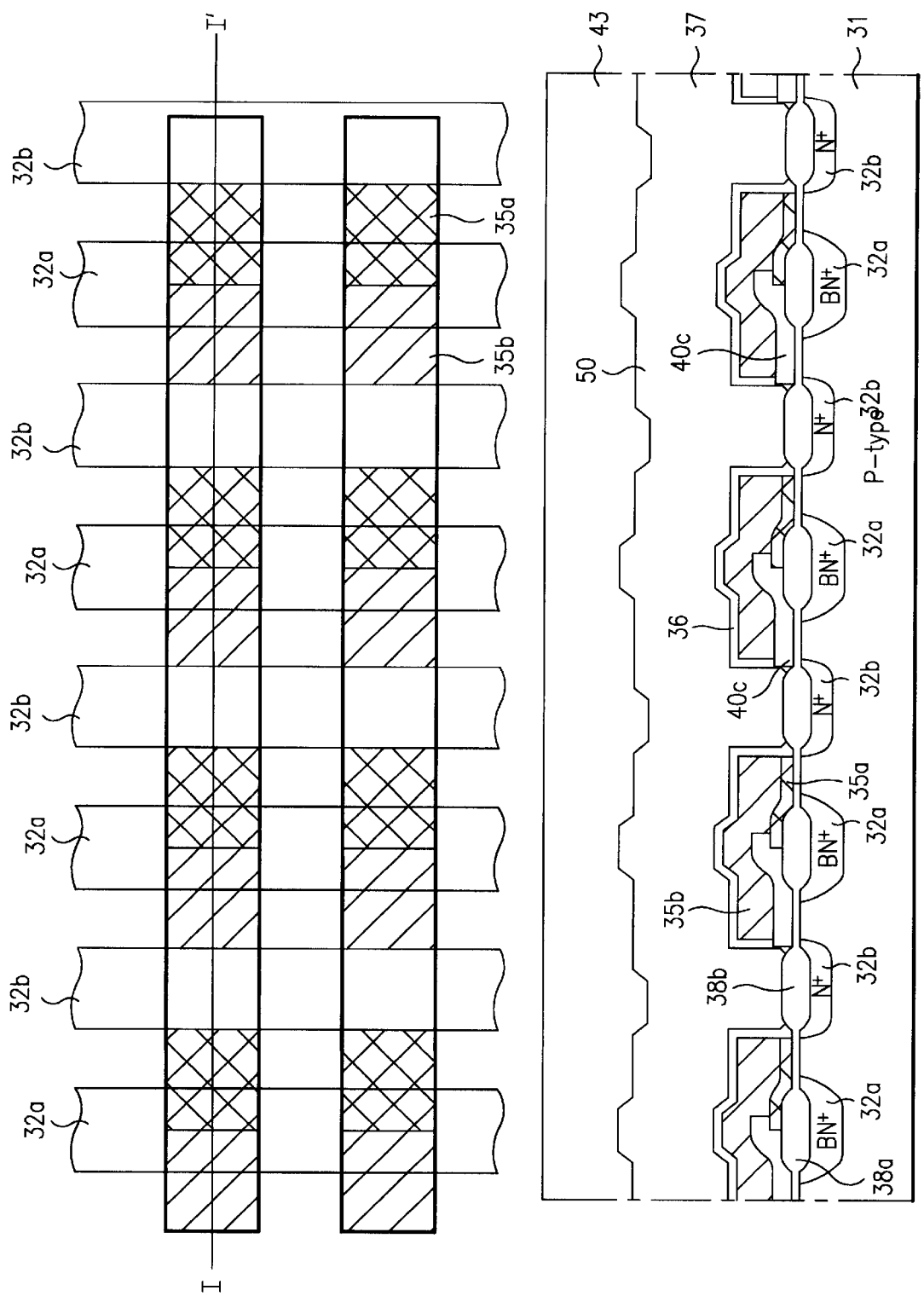

As shown in FIG. 13I, third polysilicon layer 50 is deposited on the exposed surfaces and then coated with a layer of photoresist (not shown), which is patterned by conventional exposure and development processes. Masked by the photoresist pattern, regions of third polysilicon layer 50 are removed to form a plurality of regularly-spaced, polysilicon control gates 37 (word-lines) extending along the row direction. Masked by the same photoresist pattern and the control gates, regions of second polysilicon strips 46a, insulating strips 40b, and first polysilicon strips 49a are removed in order to form a plurality of regularly-spaced second polysilicon floating gates 35b, insulating islands 40c, and first polysilicon floating gates 35a, respectively, below each of the control gates. Removal of the remaining photoresist and deposition of protective film 43 over the upper surface of the substrate complete the fabrication of the nonvolatile semiconductor memory device according to the first embodiment of the present invention.

Process steps involved in the fabrication of the nonvolatile semiconductor memory device according to the second embodiment of the present invention are described immediately below with reference to FIGS. 16A–16G.

After thermal oxide film 44 has been grown on the upper surface of lightly-doped, p-type semiconductor substrate 31, the thermal oxide film is coated with a layer of photoresist. As shown in FIG. 16A, photoresist is then selectively removed from the substrate by conventional exposure and development processes and n-type dopants are implanted into the substrate, masked by photoresist pattern 45, to form a plurality of regularly-spaced, heavily-doped, n-type common source regions 32a extending along the column direction within the substrate. Each common source region 32a has a first side and a second side along the row direction.

After the remaining photoresist and thermal oxide have been removed, a thick, isolating, oxice strip 38a is grown on the upper surface of the substrate above each of the common source regions 32a and a thin, tunneling, (gate) oxide strip 39 is grown on the upper surface of the substrate to completely cover the upper surface of the substrate between the members of each pair of adjacent isolating strips, as shown in FIG. 16B. Alternating, contiguous, isolating and tunneling strips thus together completely cover the upper surface of the substrate.

After deposition of an insulating layer over the upper surface of the substrate, regions of the insulating layer are selectively removed by conventional processes in order to form a plurality of regularly spaced, insulating strips 40a extending along the column direction and corresponding to the common source regions 32a, as shown in FIG. 16C. One of the two edges of the insulating strip 40a that corresponds to a given common source region 32a lies on the isolating strip 38a above the given common source region 32a, while the other edge of the insulating strip 40a lies on the tunneling strip 39 to the second side of and adjacent to the isolating strip 38a above the given common source region 32a.

After a first polysilicon layer 46 has been deposited over the upper surface of the substrate, the first polysilicon layer 46 is coated with a layer of photoresist, which is patterned by conventional processes in order to form photoresist pattern 47. As shown in FIG. 16D, regions of the first polysilicon layer 46 and insulating strips 40a are selectively removed by conventional processes (thereby forming a plurality of regularly-spaced first polysilicon strips 46a and insulating strips 40b, respectively, each extending along the column direction, corresponding to the common source regions 32a) in order to expose a plurality of regularly-spaced regions extending along the column direction on the tunneling strips 39.

Figure 16E:
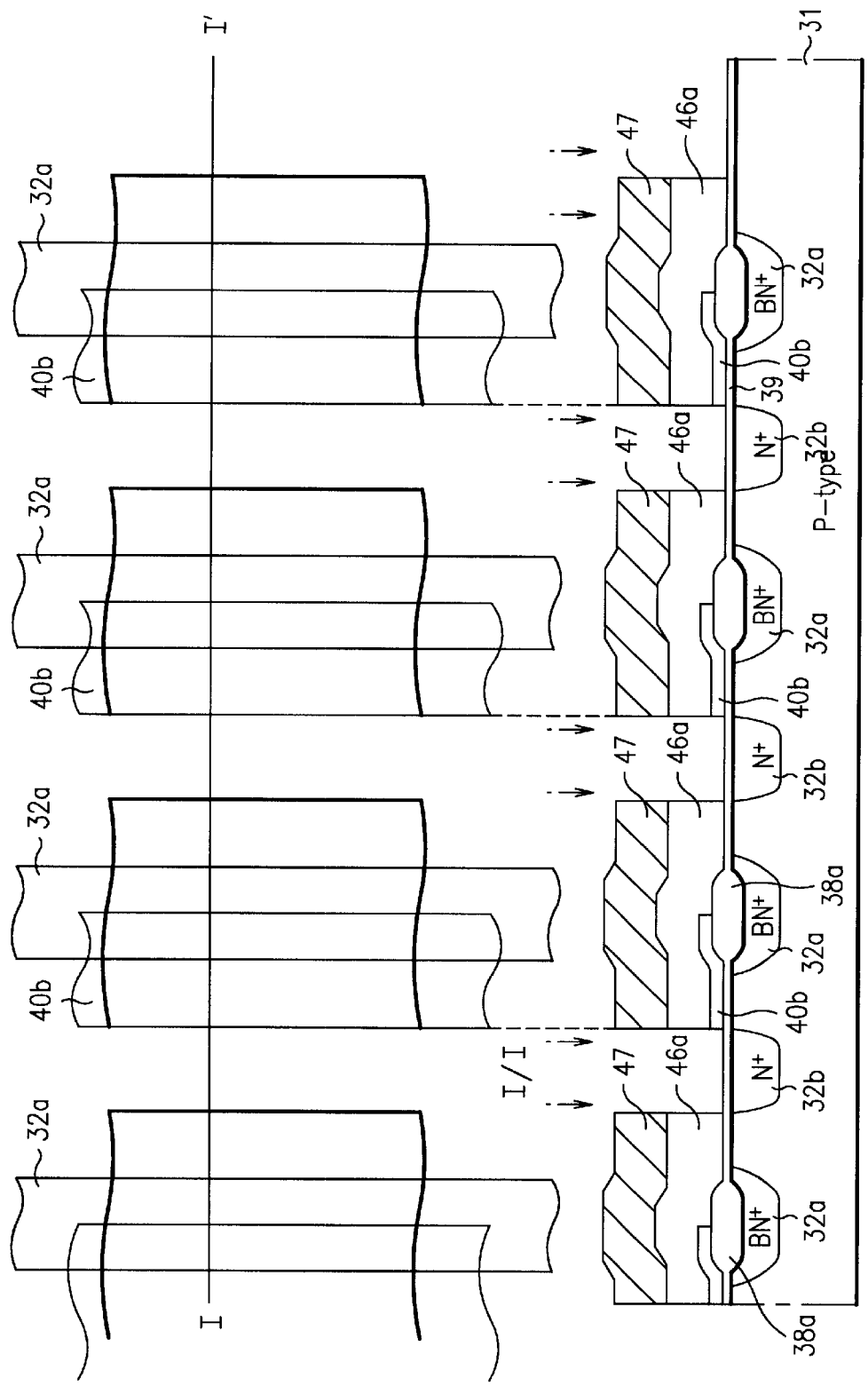

Masked by photoresist pattern 47, n-type dopants are then implanted into the substrate, as shown in FIG. 16E, in order to form a pair of heavily-doped, n-type drain regions 32b extending along the column direction within the substrate a fixed distance to either side of and adjacent to each common source region 32a. Each drain region is substantially equidistant from the common source regions 32a adjacent to it. The photoresist remaining on the wafer is removed after the drain regions have been formed.

As shown in FIG. 16F, a thick, isolating, oxide strip 38b is grown above each of the newly formed drain regions 32b and thin dielectric films 36 are formed on the exposed surfaces of the first polysilicon strips 46a and on the exposed lateral surfaces of the insulating strips 40b.

Figure 16G:
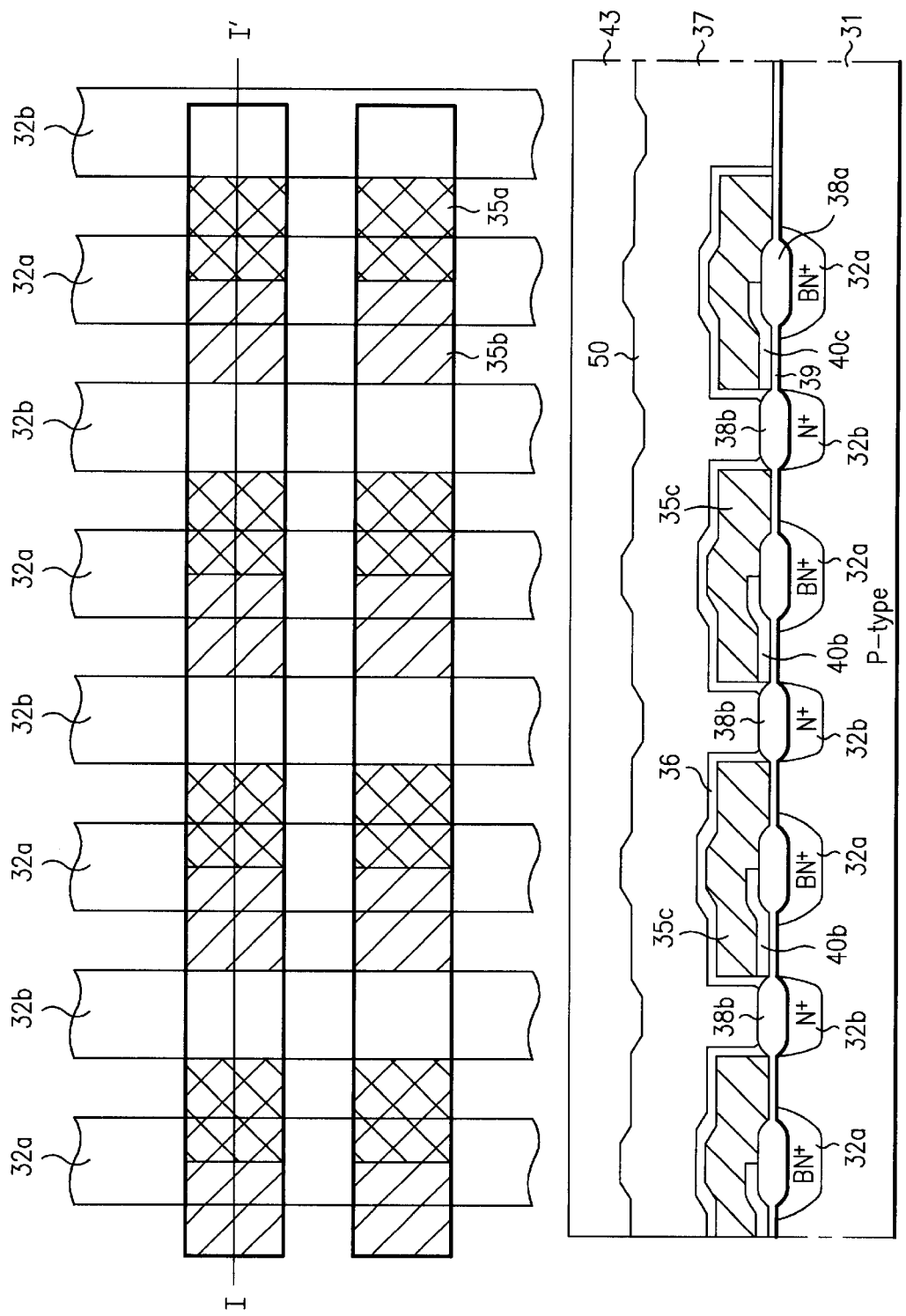

As shown in FIG. 16G, a second polysilicon layer 50 is deposited over the upper surface of the substrate, then coated with a layer of photoresist (not shown), which is patterned by conventional exposure and development processes. Masked by the photoresist pattern, regions of the second polysilicon layer 50 are removed to form a plurality of regularly-spaced polysilicon control gates 37 (word-lines) extending along the row direction. Masked by the same photoresist pattern and by the control gates, regions of the first polysilicon strips 46a and the insulating strips 40b are removed in order to form a plurality of regularly-spaced polysilicon floating gates 35c and insulating islands 40c, respectively, below each of she control gates.

Removal of the remaining photoresist and deposition of protective film 43 over the upper surface of the substrate complete fabrication of the nonvolatile semiconductor memory device according to the second embodiment of the present invention.

The nonvolatile semiconductor memory device of the present invention and the method by which the device is fabricated have the following advantages. First, capacitive coupling between the floating gates and the control gate above them is relatively large, thereby facilitating both high speed and low voltage operation of the device as well as a reduction of memory cell size. Second, since the floating gates essentially serve as a mask during formation of the drain regions, fabrication of the device incorporates self-aligning process steps. Third and most importantly, due to the asymmetry of the gate structure of the program/read and monitor transistors, programming/reading and monitoring the charge on the floating gate may be performed simultaneously.

The embodiments described above are intended to illustrate the claimed invention, but not to exhaustively delineate every detail of the invention as practiced. It will be apparent to those of ordinary skill in the art of MOS device fabrication that various modifications and variations of the device and method of the present invention may be made without departing from either the spirit or the scope of the invention. For example, the conductivity-types could be reversed such that the substrate is N-type and the source/drain regions are P-type, etc. The present invention is thus intended to cover such modifications and variations provided they fall within the scope of the appended claims and their equivalents.

What is claimed is:

1. A nonvolatile semiconductor memory cell comprising:
   a semiconductor substrate of a first conductivity type;
   a common source region of a second conductivity type in a first direction within the substrate;
   a first drain region and a second drain region of the second conductivity type in the first direction within the substrate;
   an insulating film on the substrate;
   an insulating island in direct contact with the insulating film above the common source region and also in direct contact with the insulating film to a second side of the common source region nearest the second drain region;
   a conductive first floating gate on the insulating film to a first side of the common source region nearest the first drain region, the first floating gate being contiguous to the insulating island;

a conductive second floating gate on the first floating gate and also on the insulating island;

a dielectric film on exposed surfaces of both the first and second floating gates; and a conductive control gate in a second direction on the dielectric film on the second floating gate.

2. The nonvolatile semiconductor memory cell according to claim 1, wherein the insulating film above each of the common source and drain regions is thicker than the insulating film above any other region of the substrate.

3. The nonvolatile semiconductor memory cell according to claim 1, wherein said conductive first floating gate is also partially on the insulating film above the common source region.

4. The nonvolatile semiconductor memory cell according to claim 2, wherein said conductive first floating gate is also partially on the insulating film above the common source region.

5. The nonvolatile semiconductor memory cell according to claim 1, wherein the conductive first floating gate layer extends partially under said insulating island.

6. The nonvolatile semiconductor memory cell according to claim 1, wherein the dielectric film is a thermal oxide or an ONO composite.

7. A nonvolatile semiconductor memory cell comprising:

a semiconductor substrate of a first conductivity type in a first direction within the substrate;

a first drain region and a second drain region of the second conductivity type in the first direction within the substrate;

an insulating film on the substrate;

an insulating island in direct contact with the insulating film above the common source region and also in direct contact with the insulating film on a second side of the common source region nearest the second drain region;

a conductive floating gate on the insulating island and also on the insulating film to a first side of the common source region nearest the first drain region;

a dielectric film on exposed surfaces of the floating gate; and a conductive control gate in a second direction on the dielectric film on the floating gate.

8. The nonvolatile semiconductor memory cell according to claim 5, wherein the-insulating film above each of the common source and drain regions is thicker than the insulating film above any other region of the substrate.

9. The nonvolatile semiconductor memory cell according to claim 5, wherein said conductive floating gate is also on the insulating film above the common source region.

10. The nonvolatile semiconductor memory cell according to claim 6, wherein said conductive floating gate is also on the insulating film above the common source region.

11. The nonvolatile semiconductor memory cell according to claim 7, wherein the dielectric film is a thermal oxide or an ONO composite.

12. A nonvolatile semiconductor memory cell structure having a pair of transistors sharing an asymmetric floating gate structure, the memory cell structure comprising:

a semiconductor substrate of a first conductivity type;

a common source region of said second conductivity type in said substrate;

a first drain region of a second conductivity type located on a first side of said common source region in said substrate;

a second drain region of said second conductivity type located on a second of said common source region in said substrate;

an insulating spacer located over a part of said common source region corresponding to said second side and extending laterally beyond said second side;

an asymmetric floating gate structure lying partially on said insulating spacer and centered above and extending laterally beyond said first and second sides of said common source region, said gate structure having first and second portions corresponding to said first and second sides of said common source region, respectively, said first portion being located more closely to said common source region than said second portion because of said insulating spacer therebetween such that said gate structure is asymmetric; and a control gate on said floating gate structure.

13. The cell structure of claim 12, wherein said asymmetric floating gate structure includes a first floating gate layer and a second floating gate layer, said first floating gate layer being located oppositely to said insulating spacer such that said first floating gate layer is located over and extends laterally beyond a first side of said common source region.

14. The cell structure of claim 13, wherein a thickness of said first floating gate layer is less than a thickness of said insulating spacer such that said second floating gate layer is asymmetric about said common source region.

15. The structure of claim 13, wherein said first floating gate layer extends partially under said insulating spacer.

16. The cell structure as in claim 12, further comprising a insulating layer on said substrate and under said insulating spacer and said gate structure, said insulating layer being thick where located over said common source region and said first and second drain regions and thin elsewhere.

17. The cell structure of claim 12, further comprising:

a dielectric layer on exposed surfaces of said insulating spacer and said gate structure underneath said control gate.

18. The cell structure of claim 17, wherein said dielectric layer is a thermal oxide or an ONO composite.

19. The nonvolatile semiconductor memory device according to claim 1, wherein the drain regions are a fixed distance to either side of the common source regions.

20. The nonvolatile semiconductor memory device according to claim 7, wherein the drain regions are a fixed distance to either side of the common source regions.

* * * * *